(12) United States Patent
Nam et al.

(10) Patent No.: US 12,127,357 B2
(45) Date of Patent: Oct. 22, 2024

(54) ELECTRONIC DEVICE INCLUDING SUPPORT PLATE, AND METHOD FOR MANUFACTURING THE SUPPORT PLATE

(71) Applicant: SAMSUNG DISPLAY CO., LTD., Yongin-si (KR)

(72) Inventors: Hosung Nam, Seoul (KR); Hoseung Kang, Asan-si (KR); Minseop Kim, Cheonan-si (KR); Sang Wol Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 341 days.

(21) Appl. No.: 17/394,212

(22) Filed: Aug. 4, 2021

(65) Prior Publication Data

US 2022/0174828 A1    Jun. 2, 2022

(30) Foreign Application Priority Data

Nov. 30, 2020    (KR) .................. 10-2020-0164311

(51) Int. Cl.
| | |
|---|---|
| *G06F 1/16* | (2006.01) |
| *H05K 5/02* | (2006.01) |
| *H04M 1/02* | (2006.01) |

(52) U.S. Cl.
CPC ......... *H05K 5/0217* (2013.01); *G06F 1/1641* (2013.01); *G06F 1/1652* (2013.01); *H04M 1/0268* (2013.01)

(58) Field of Classification Search
CPC ........ B21D 28/02; B21D 28/24; B21D 28/26; B21D 28/265; B21D 35/001; G06F 1/1641; G06F 1/1652

(Continued)

(56) References Cited

U.S. PATENT DOCUMENTS

| 3,116,542 A | * | 1/1964 | Niekamp | B21D 22/04 |
| | | | | 29/896.6 |
| 5,791,186 A | * | 8/1998 | Nishida | B21D 22/02 |
| | | | | 72/337 |

(Continued)

FOREIGN PATENT DOCUMENTS

| KR | 10-1834793 | 3/2018 |
| KR | 10-2020-0049925 | 5/2020 |

OTHER PUBLICATIONS

CN 108555130A, Mo et al. Sep. 2018.*
KR 20100135435A, Kim Dec. 2010.*
KR 100212717B1, Kim Aug. 1999.*

*Primary Examiner* — Edward T Tolan
(74) *Attorney, Agent, or Firm* — F. CHAU & ASSOCIATES, LLC

(57) ABSTRACT

An electronic device includes a display module and a support plate disposed below the display module and in which an opening pattern is formed that corresponds to a foldable area. The support plate includes a top surface adjacent to the display module and a bottom surface that faces the top surface, and the opening pattern includes an opening that passes through the support plate from the top surface to the bottom surface and a plurality of support parts around the opening. In addition, in a cross-section, the support parts include at least one first support part that includes a first curved edge at one side of the top surface and a second curved edge at one side of the bottom surface that faces the first curved edge in a diagonal direction.

9 Claims, 29 Drawing Sheets

(58) Field of Classification Search
USPC .................................................. 72/333, 404
See application file for complete search history.

(56) References Cited

U.S. PATENT DOCUMENTS

| | | | |
|---|---|---|---|
| 10,727,435 B2 | 7/2020 | Kim et al. | |
| 11,045,858 B2* | 6/2021 | Zalduegui | B23K 26/38 |
| 2009/0098404 A1* | 4/2009 | Matsuyama | B21D 28/26 |
| | | | 73/788 |
| 2012/0180911 A1* | 7/2012 | Bartolomucci | C21D 1/25 |
| | | | 148/624 |
| 2017/0334086 A1* | 11/2017 | Cheung | B21D 28/265 |
| 2019/0060973 A1* | 2/2019 | Yasutomi | B21D 28/34 |
| 2020/0266455 A1* | 8/2020 | Wang | H01M 8/0206 |

\* cited by examiner

FIG. 5
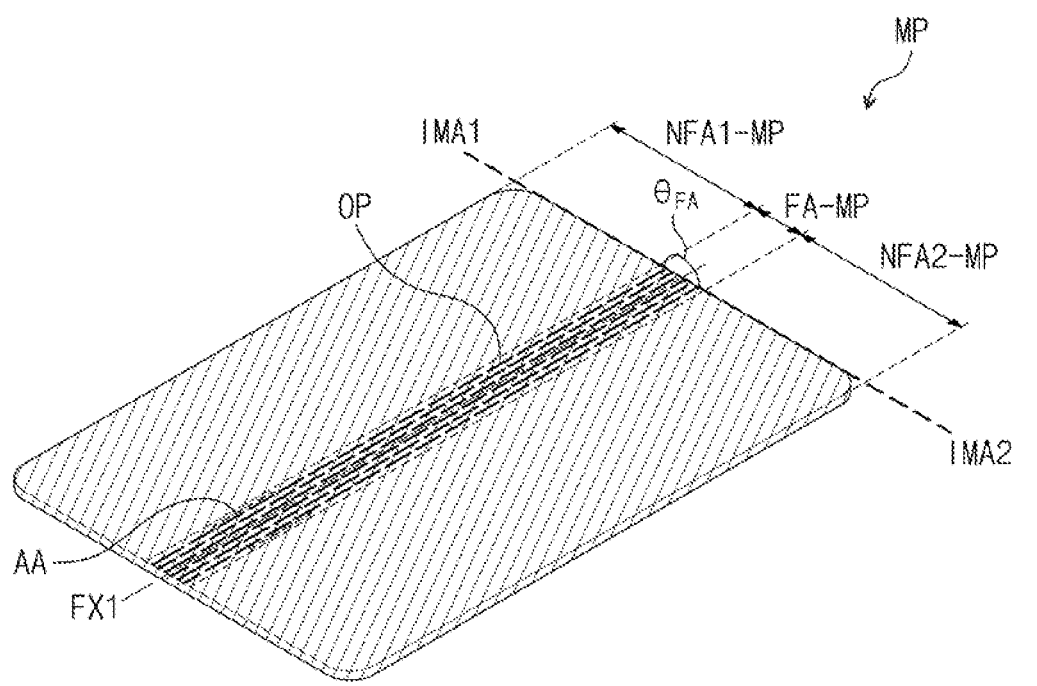
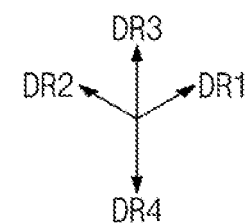

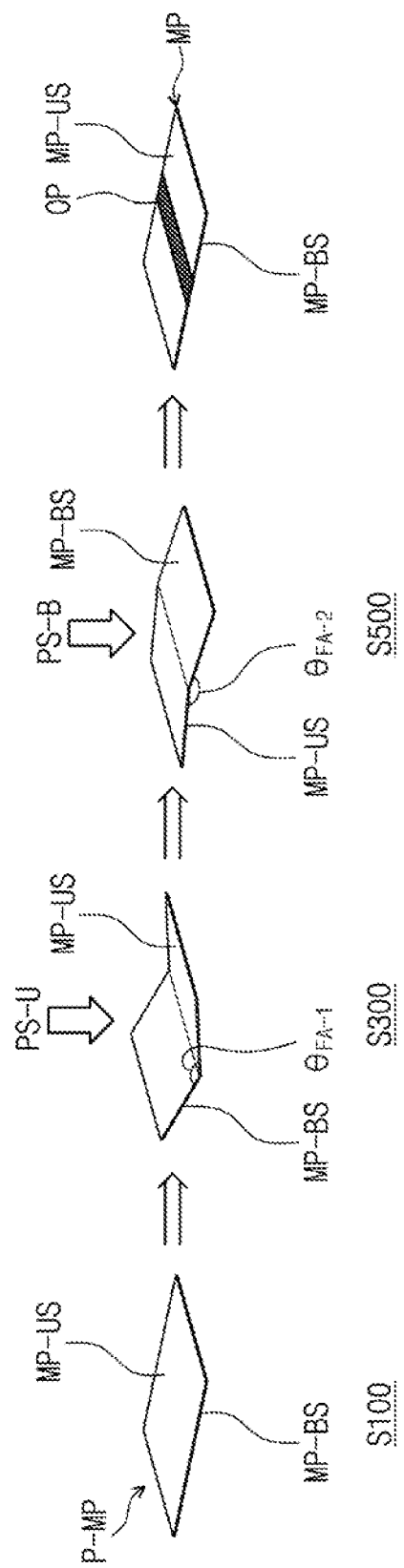

FIG. 21C
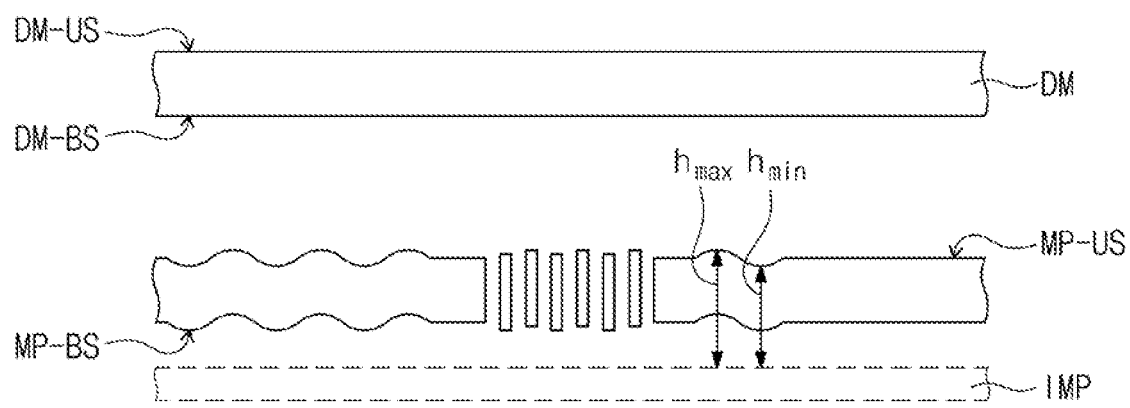
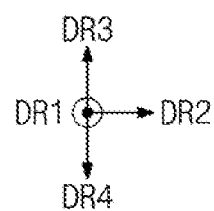

ELECTRONIC DEVICE INCLUDING SUPPORT PLATE, AND METHOD FOR MANUFACTURING THE SUPPORT PLATE

CROSS-REFERENCE TO RELATED APPLICATIONS

This U.S. non-provisional patent application claims priority under 35 U.S.C. § 119 from Korean Patent Application No. 10-2020-0164311, filed on Nov. 30, 2020 in the Korean Intellectual Property Office, the contents of which are herein incorporated by reference in their entirety.

TECHNICAL FIELD

Embodiments of the present disclosure are directed to a method for manufacturing a support plate and an electronic device that includes the support plate, and more particularly, to a flexible electronic device and a method for manufacturing a support plate provided in the electronic device.

DISCUSSION OF THE RELATED ART

Various types of electronic devices can provide image information. With the advancement of technology, display devices that include flexible display panels that are foldable and bendable have been developed. Unlike a rigid display device, a flexible display device can change into various shapes by being folded, rolled, or bent, so that a flexible display device is portable regardless of the size of a displayed screen.

A flexible display device should have a support member that supports the display panel without impeding the folding or bending operation, and a flexible support member whose mechanical properties will not deteriorate over time is required.

SUMMARY

Embodiments of the present disclosure provide a method for manufacturing a support plate having good mechanical strength and improved flatness.

Embodiments of the present disclosure also provide an electronic device that has improved external flatness and good bending properties.

An embodiment of the inventive concept provides an electronic device that includes a foldable area that is configured to be folded with respect to a folding axis that extends in a first direction and non-foldable areas that are spaced apart from each other with the foldable area therebetween; a display module; and a support plate disposed below the display module and in which an opening pattern is formed that corresponds to the foldable area. The support plate includes a top surface adjacent to the display module and a bottom surface that faces the top surface. The opening pattern includes an opening that passes through the support plate from the top surface to the bottom surface and a plurality of support parts around the opening. In a cross-section, each of the plurality of support parts includes at least one first support part that includes a first curved edge at one side of the top surface and a second curved edge at one side of the bottom surface that faces the first curved edge in a diagonal direction.

In an embodiment, the at least one first support part includes a first flat top surface adjacent to the first curved edge and a first flat bottom surface adjacent to the second curved edge, and each of the first flat top surface and the first flat bottom surface is inclined with respect to a virtual extension surface that is parallel to a surface of the support plate that corresponds to the non-foldable area.

In an embodiment, a first angle between the first flat top surface and the virtual extension surface and a second angle between the first flat bottom surface and the virtual extension surface are each greater than 0 degree and less than about 15 degrees.

In an embodiment, the first support part includes a first sub-support part and a second sub-support part that are adjacent to each other with the opening therebetween. The first flat top surface of the first sub-support part is inclined in a counterclockwise direction with respect to the virtual extension surface, and the first flat top surface of the second sub-support part is inclined in a clockwise direction with respect to the virtual extension surface.

In an embodiment, the first flat top surface of the first sub-support part and the first flat top surface of the second sub-support part are symmetric to each other with respect to a center of the opening therebetween.

In an embodiment, in the cross-section, the support plate further include a second support part that includes a third curved edge at one side of the top surface and a fourth curved edge at an other side of the top surface that is spaced apart from the third curved edge.

In an embodiment, the second support part includes a second flat top surface disposed between the third curved edge and the fourth curved edge. The second flat top surface is inclined with respect to the virtual extension surface that is parallel to a surface of the support plate that corresponds to the non-foldable area.

In an embodiment, on a plane, a width of the opening in the first direction is greater than a width of the opening in a second direction perpendicular to the first direction.

In an embodiment, the support plate has a flatness of about 0.15 mm or less, and the flatness may correspond to a difference between a maximum height and a minimum height of the top surface of the support plate with respect to a virtual reference surface parallel to the bottom surface of the display module.

In an embodiment, the support plate includes a foldable part that is configured to be folded with respect to the folding axis and first and second non-foldable parts that are spaced apart from each other with the foldable part therebetween. An angle between an extension surface of the first non-foldable part and an extension surface of the second non-foldable part ranges from about 120 degrees to about 180 degrees.

An embodiment of the inventive concept provides a method for manufacturing a support plate that includes: providing a member to be processed, wherein the member to be processed includes a top surface and a bottom surface that face each other, and the member to be processed is divided into a foldable part and a non-foldable part; forming, in a first press process, a first opening pattern on the folding part by using a first press from a direction of the top surface of the member to be processed; and forming, in a second press process, a second opening pattern on the foldable part by using a second press from a direction of the bottom surface of the member to be processed.

In an embodiment, the first opening pattern includes an opening that passes through the member to be processed from the top surface to the bottom surface and a plurality of preliminary support parts spaced apart from each other with the opening therebetween, and each of the preliminary support parts includes a curved edge on the top surface adjacent to the opening.

In an embodiment, the second press process includes patterning at least one of the preliminary support parts by using the second press.

In an embodiment, the second press process forms the opening in at least one of the preliminary support parts, and the second press process includes forming a first support part adjacent to the opening, wherein the first support part includes a first curved edge at one side of the top surface and a second curved edge at one side of the bottom surface that faces the first curved edge in a diagonal direction.

In an embodiment, the method further includes a reversing process that reverses the directions of the top surface and the bottom surface of the member to be processed between the first press process and the second press process.

In an embodiment, the first press process forms a plurality of openings that do not overlap each other and are parallel to a first direction in the foldable part, and on a plane, a first width each of the openings in the first direction may be greater than a second width of each of the openings in a second direction perpendicular to the first direction.

In an embodiment, the first press process may forms a plurality of first openings that are spaced a first interval apart from each other in the second direction in each of a plurality of first pattern areas that are spaced apart from each other in the first direction.

In an embodiment, the first press process further includes at least one of: a process of forming a plurality of second openings that are spaced a second interval from each other in the first pattern areas or a second pattern area disposed between the first pattern areas; or a process of forming a plurality of third openings that are spaced a third interval apart from each other, wherein each of the plurality of third openings passes through a portion of the first pattern area and a portion of the second pattern area that are adjacent to each other.

In an embodiment, the second press process includes forming a plurality of fourth openings that are spaced a fourth interval apart from each other, wherein each of the plurality of fourth openings passes through a portion of the first pattern area and a portion of the second pattern area that are adjacent to each other.

In an embodiment, the second press process includes forming a plurality of fifth openings that are spaced a fifth interval apart from each other in the first pattern areas or a second pattern area located between the first pattern areas.

BRIEF DESCRIPTION OF THE FIGURES

FIG. 5 is a perspective view of a support plate according to an embodiment.

FIG. 16 illustrates a method for manufacturing a support plate according to an embodiment.

FIG. 21C is a schematic view that illustrates a method for evaluating the flatness of a support plate according to an embodiment.

DETAILED DESCRIPTION

Figure 1A:
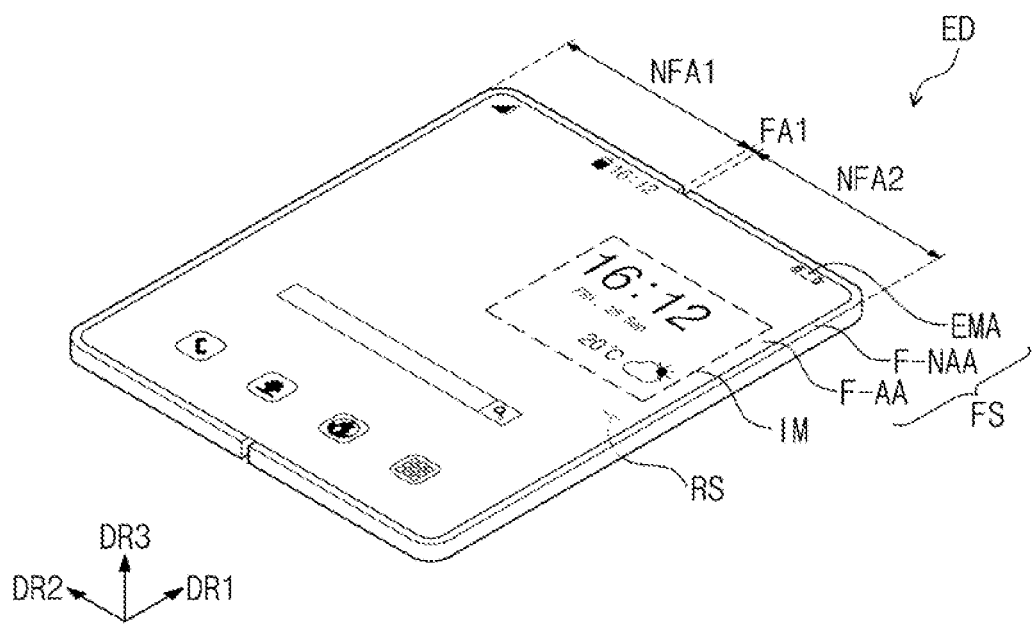
FIG. 1A is a perspective view of an unfolded electronic device according to an embodiment.

Since the present disclosure may have diverse modified embodiments, specific embodiments are illustrated in the drawings and are described in the detailed description of the inventive concept. However, this does not limit the inventive concept within specific embodiments and it should be understood that the inventive concept covers all the modifications, equivalents, and replacements within the idea and technical scope of the inventive concept.

In this specification, it will also be understood that when one component (or area, layer, portion) is referred to as being "on", "connected to", or "coupled to" another component, it can be directly disposed/connected/coupled on/to the one component, or an intervening third component may also be present.

Like reference numerals may refer to like elements throughout. Direction axes illustrated in the drawings, and directions indicated by the direction axes that are described in this specification, are relative concepts and thus may be changed into different directions.

Herein, when one value is described as being about equal to another value, e.g. "a width may be from about 0.1 mm to about 1 mm", it is to be understood that the values are equal to each other to within a measurement error, or if measurably unequal, are close enough in value to be functionally equal to each other as would be understood by a person having ordinary skill in the art.

Hereinafter, an electronic device according to an embodiment of the inventive concept and a method for manufacturing a support plate according to the embodiment will be described with reference to the drawings.

Figure 1B:
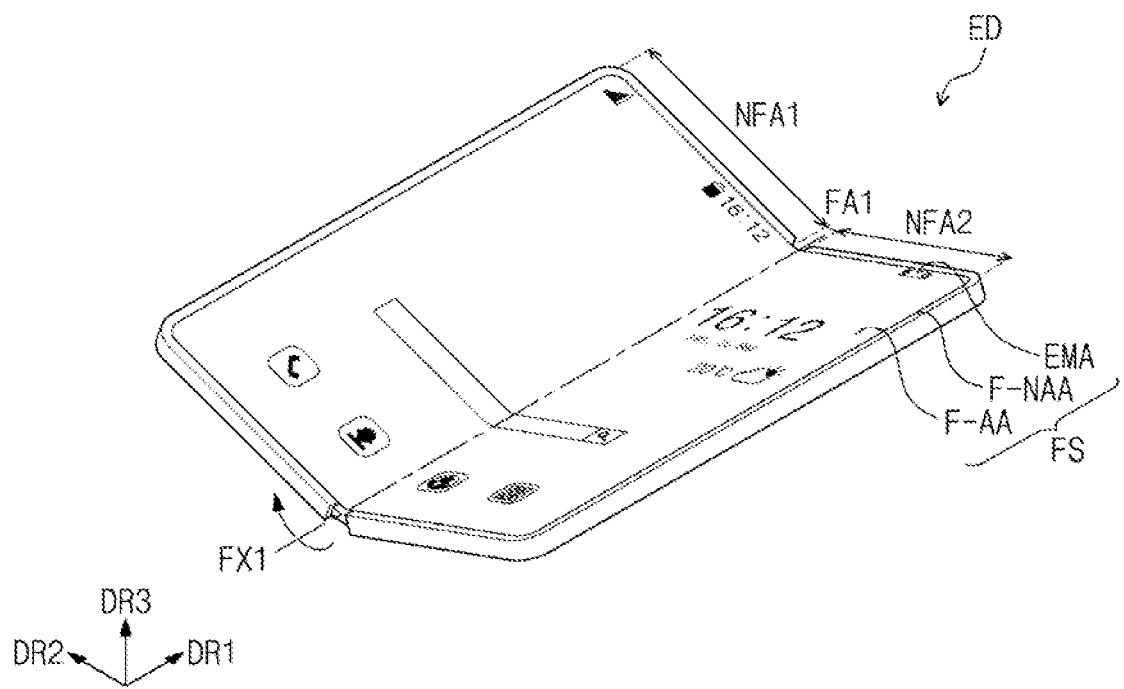
FIG. 1B is a perspective view of a process of in-folding an electronic device of FIG. 1A according to an embodiment.
Figure 1C:
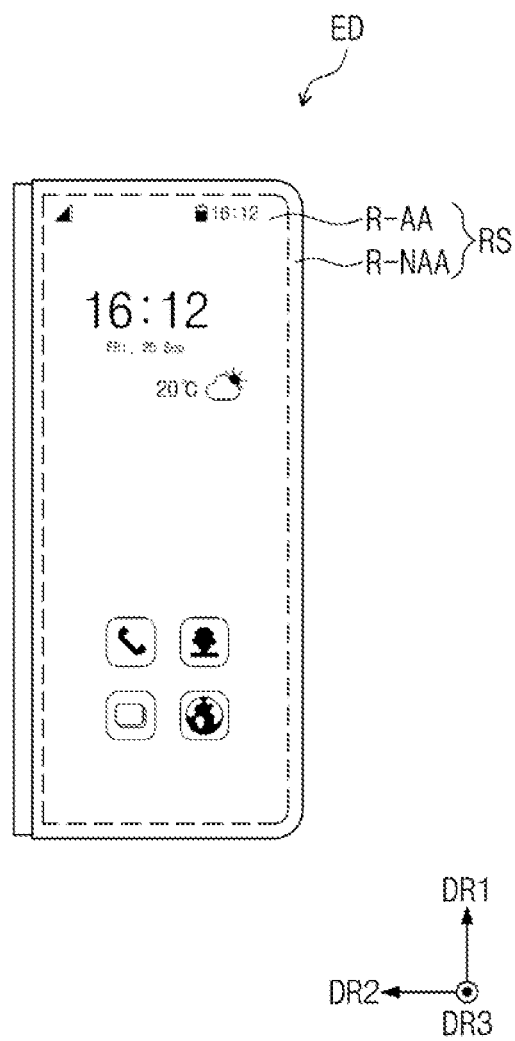
FIG. 1C is a plan view of an in-folded electronic device of FIG. 1A according to an embodiment.
Figure 1D:
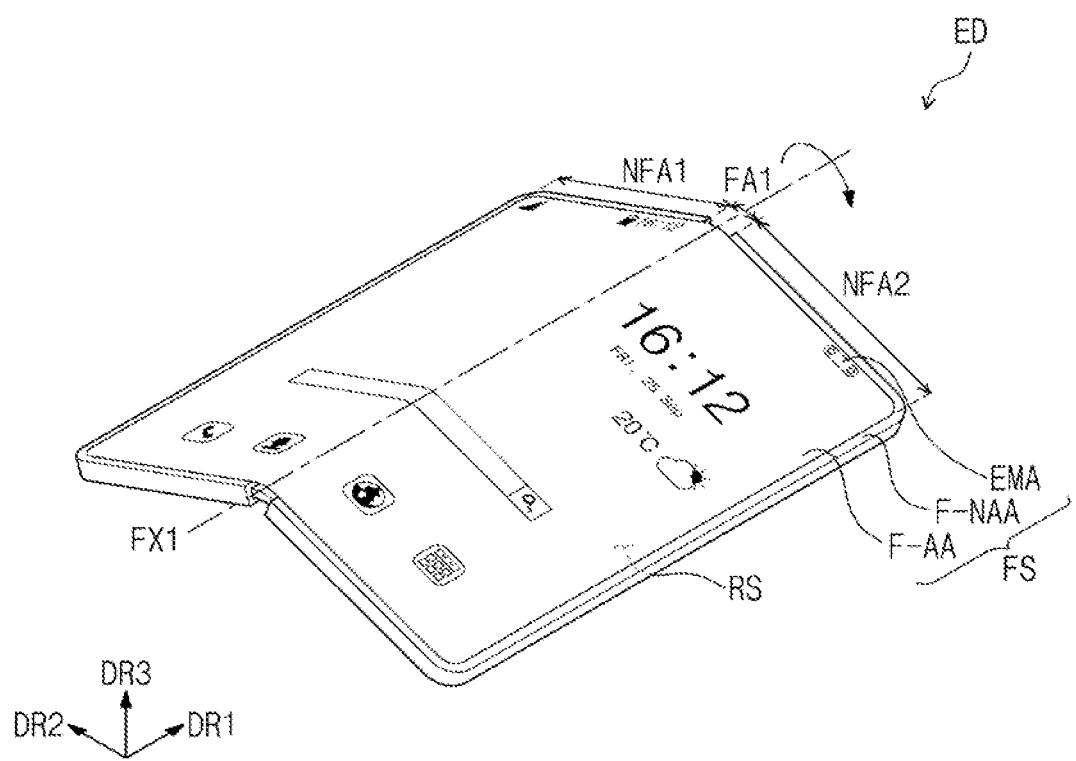
FIG. 1D is a perspective view of a process of out-folding an electronic device according to an embodiment.

FIG. 1A is a perspective view of an unfolded electronic device according to an embodiment. FIG. 1B is a perspective view of a process of in-folding an electronic device of FIG. 1A according to an embodiment. FIG. 1C is a plan view of an in-folded electronic device of FIG. 1A according to an embodiment. FIG. 1D is a perspective view of a process of out-folding an electronic device according to an embodiment.

An electronic device ED according to an embodiment is activated according to an electrical signal. For example, the electronic device ED may be a mobile phone, a tablet PC, a car navigation system, a game console, or a wearable device, but embodiments of the inventive concept are not limited thereto. In an embodiment of the inventive concept illustrated in FIG. 1A, the electronic device ED is a mobile phone.

Referring to FIGS. 1A and 1B, the electronic device ED according to an embodiment includes a first display surface FS that extends in a first direction axis DR1 and a second direction axis DR2 that intersects the first direction axis DR1. The electronic device ED displays an image IM to a user through the first display surface FS. The electronic device ED according to an embodiment display the image IM in a third direction axis DR3 that is perpendicular to a plane defined the first direction axis DR1 and the second direction axis DR2. In this specification, a front surface (or a top surface) and a rear surface (or a bottom surface) of components of the electronic device ED are defined based on the direction in which the image IM is displayed. The front and rear surfaces may be opposite to each other in the third direction axis DR3. A normal direction of each of the front and rear surfaces is parallel to the third direction axis DR3.

The electronic device ED according to an embodiment may include the first display surface FS and a second display surface RS. The first display surface FS includes a first active area F-AA and a first peripheral area F-NAA. An electronic module area EMA is included in the first active area F-AA. The second display surface RS is a surface that faces at least a portion of the first display surface FS. That is, the second display surface RS is a portion of a rear surface of the electronic device ED.

The electronic device ED according to an embodiment can sense an external applied input. The external input includes various types of external inputs. For example, the electronic device ED can sense an adjacent object that is less than a predetermined distance from the electronic device ED, as well as a contact from a portion of a human body such as a user's hand. In addition, the external input includes a force, a pressure, a temperature, light, etc.

According to an embodiment, the first display surface FS of the electronic device ED includes the first active area F-AA and the first peripheral area F-NAA. The first active area F-AA is activated by an electrical signal. The electronic device ED displays the image IM through the first active area F-AA. In addition, various types of external inputs can be sensed on the first active area F-AA. The first peripheral area F-NAA is adjacent to the first active area F-AA. The first peripheral area F-NAA may have a predetermined color. The first peripheral area F-NAA surrounds the first active area F-AA. Accordingly, a shape of the first active area F-AA is substantially defined by the first peripheral area F-NAA. However, embodiments are not limited thereto, and in other embodiments, the first peripheral area F-NAA may be disposed adjacent to only one side of the first active area F-AA or may be omitted. The active area of the electronic device ED may have one of various shapes, but is not limited to a specific embodiment.

According to an embodiment, the electronic device ED include a foldable area FA1 and non-foldable areas NFA1 and NFA2. The electronic device ED includes a plurality of non-foldable areas NFA1 and NFA2. The electronic device ED includes the first non-foldable area NFA1 and the second non-foldable area NFA2 with the foldable area FA1 disposed therebetween. An example of an electronic device ED that includes one foldable area FA1 is illustrated in FIGS. 1A to 1D, but embodiments are not limited thereto. For example, the electronic device ED may have a plurality of foldable areas.

Referring to FIG. 1B, according to an embodiment, the electronic device ED can be folded based about a first folding axis FX1. The first folding axis FX1 is a virtual axis that extends in the first direction DR1, and the first folding axis FX1 is parallel to a long side of the electronic device ED. The first folding axis FX1 extends along the first direction axis DR1 on the first display surface FS.

In an embodiment, the non-foldable areas NFA1 and NFA2 are located adjacent to the foldable area FA1 with the foldable area FA1 therebetween. For example, the first non-foldable area NFA1 is located at one side of the foldable area FA in the second direction DR2, and the second non-foldable area NFA2 is located at the other side of the foldable area FA1 in the second direction DR1.

In an embodiment, the electronic device ED can be folded with respect to the first folding axis FX1 and thus be deformed into an in-folded state in which one area of the first display surface FS that overlaps the first non-foldable area NFA1 faces the other area of the first display surface FS that overlaps the second non-foldable area N FA2.

Referring to FIG. 1C, in an embodiment, the second display surface RS can be visually recognized by a user in the in-folded state. The second display surface RS includes a second active area R-AA that displays an image and a second peripheral area R-NAA adjacent to the second active area R-AA. The second active area R-AA is activated by an electrical signal. The second active area R-AA can display an image and sense various types of external inputs. The second peripheral area R-NAA may have a predetermined color. The second peripheral area R-NAA surrounds the second active area R-AA. In addition, although not shown, the second display surface RS may further include an electronic module area on which electronic modules that include various types of constituents are disposed, but embodiments are not limited thereto.

Referring to FIG. 1D, in an embodiment, the electronic device ED can be folded with respect to the first folding axis FX1 into an out-folded state in which one area of the second display surface RS that overlaps the first non-foldable area NFA1 faces the other area of the second display surface RS that overlaps the second non-foldable area NFA2.

However, embodiments are not limited thereto. For example, the electronic device ED may be folded with respect to a plurality of folding axes so that a portion of the first display surface FS and a portion of the display surface RS face each other. Here, the number of folding axes and the number of non-foldable areas are not specifically limited.

In an embodiment, various electronic modules can be disposed on the electronic module area EMA. For example, the electronic module can include at least one of a camera, a speaker, an optical sensing sensor, or a thermal sensing sensor. The electronic module area EMA can sense an external subject through the first or second display surface FS or RS or output a sound signal such as voice through the first or second display surface FS or RS. The electronic module may include a plurality of constituents, but embodiments are not limited thereto.

In an embodiment, the electronic module area EMA is surrounded by the first active area F-AA and the first peripheral area F-NAA. However, embodiments of the inventive concept are not limited thereto. For example, in other embodiments, the electronic module area EMA may be disposed on the first active area F-AA.

Figure 2A:
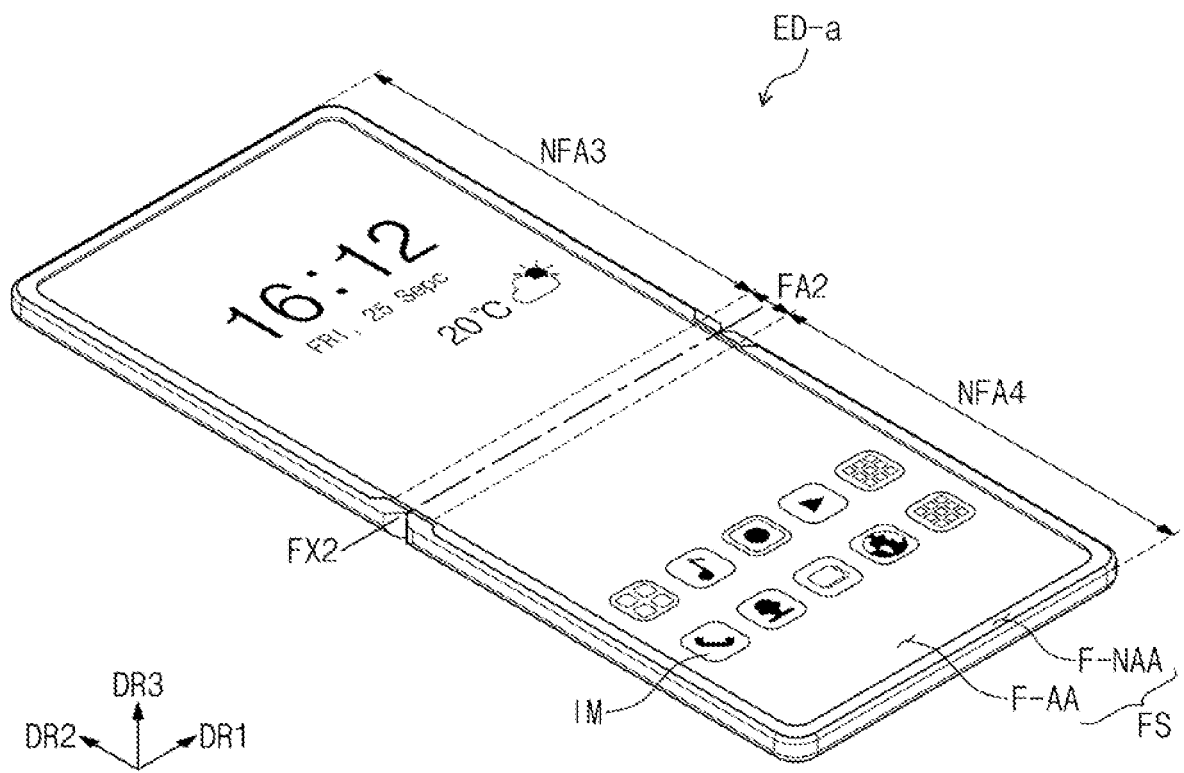
FIG. 2A is a perspective view of an unfolded electronic device according to an embodiment.
Figure 2B:
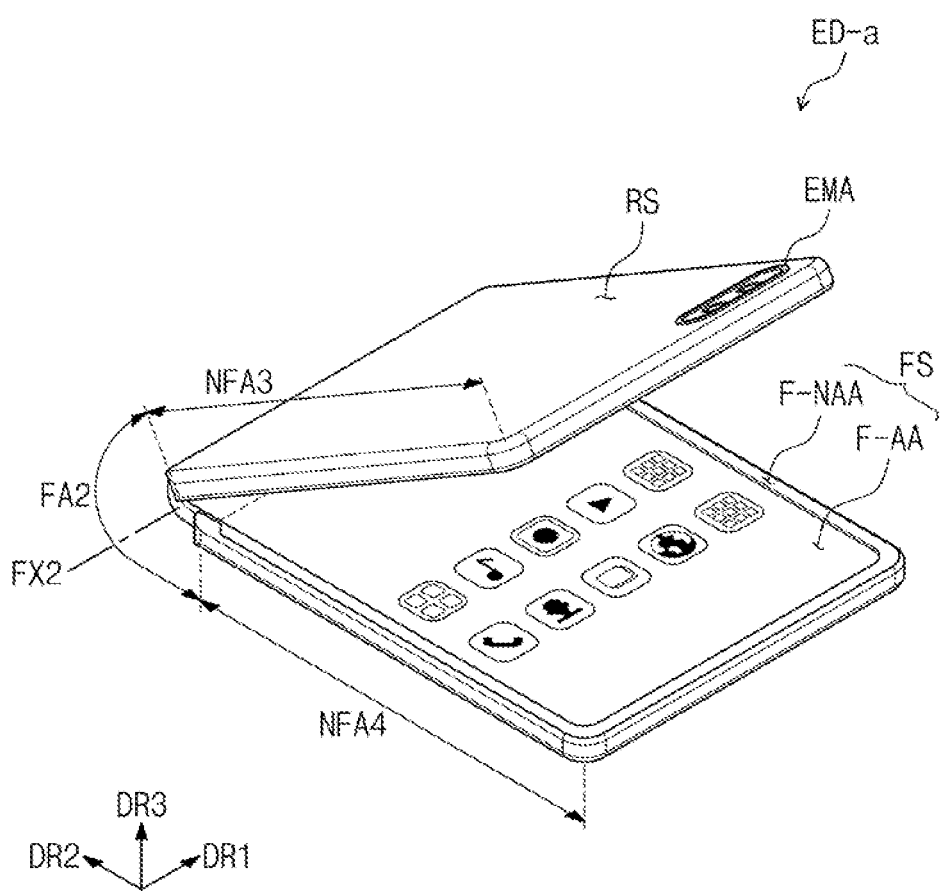
FIG. 2B is a perspective view of a process of in-folding an electronic device of FIG. 2A according to an embodiment.

FIG. 2A is a perspective view of an unfolded electronic device according to an embodiment. FIG. 2B is a perspective view that illustrates a process of in-folding an electronic device of FIG. 2A according to an embodiment.

An electronic device ED-a according to an embodiment can be folded with respect to a second folding axis FX2 that extends parallel to the first direction DR1. FIG. 2B illustrates a case in which the extension direction of the second folding axis FX2 is parallel to a short side of the electronic device ED-a. However, embodiments of the inventive concept are not limited thereto.

The electronic device ED-a according to an embodiment includes at least one foldable area FA2 and a plurality of non-foldable areas NFA3 and NFA4 that extend from the foldable area FA2. The non-foldable areas NFA3 and NFA4 are spaced apart from each other in a second direction DR2 that crosses the first direction DR1 with the foldable area FA2 located therebetween.

In an embodiment, the foldable area FA2 has a predetermined curvature and a predetermined curvature radius when folded. In an embodiment, the first non-foldable area NFA3 and the second non-foldable area NFA4 face each other, and the electronic device ED-a is in-folded so that a display surface FS is not externally exposed.

In addition, in an embodiment, the electronic device ED-a can be out-folded so that the display surface FS is externally exposed. In an embodiment, in the electronic device ED-a, the first display surface FS is visible to a user in an unfolded state, and the second display surface RS is visible to the user in an in-folded state. The second display surface RS includes an electronic module area EMA in which electronic modules that include various types of constituents can be disposed.

The electronic device ED-a according to an embodiment includes the second display surface RS, and the second display surface RS faces at least a portion of the first display surface FS. In an in-folded state, the second display surface RS is visible to the user. In an embodiment, an image is displayed through the second display surface RS.

In an embodiment, the electronic devices ED and ED-a are configured so that an in-folding or out-folding operation can be repeated with respect to each other, but embodiments are not limited thereto. In an embodiment, the electronic devices ED and ED-a may be configured to perform one of the unfolding operations, such as an in-folding operation or an out-folding operation.

Figure 3:
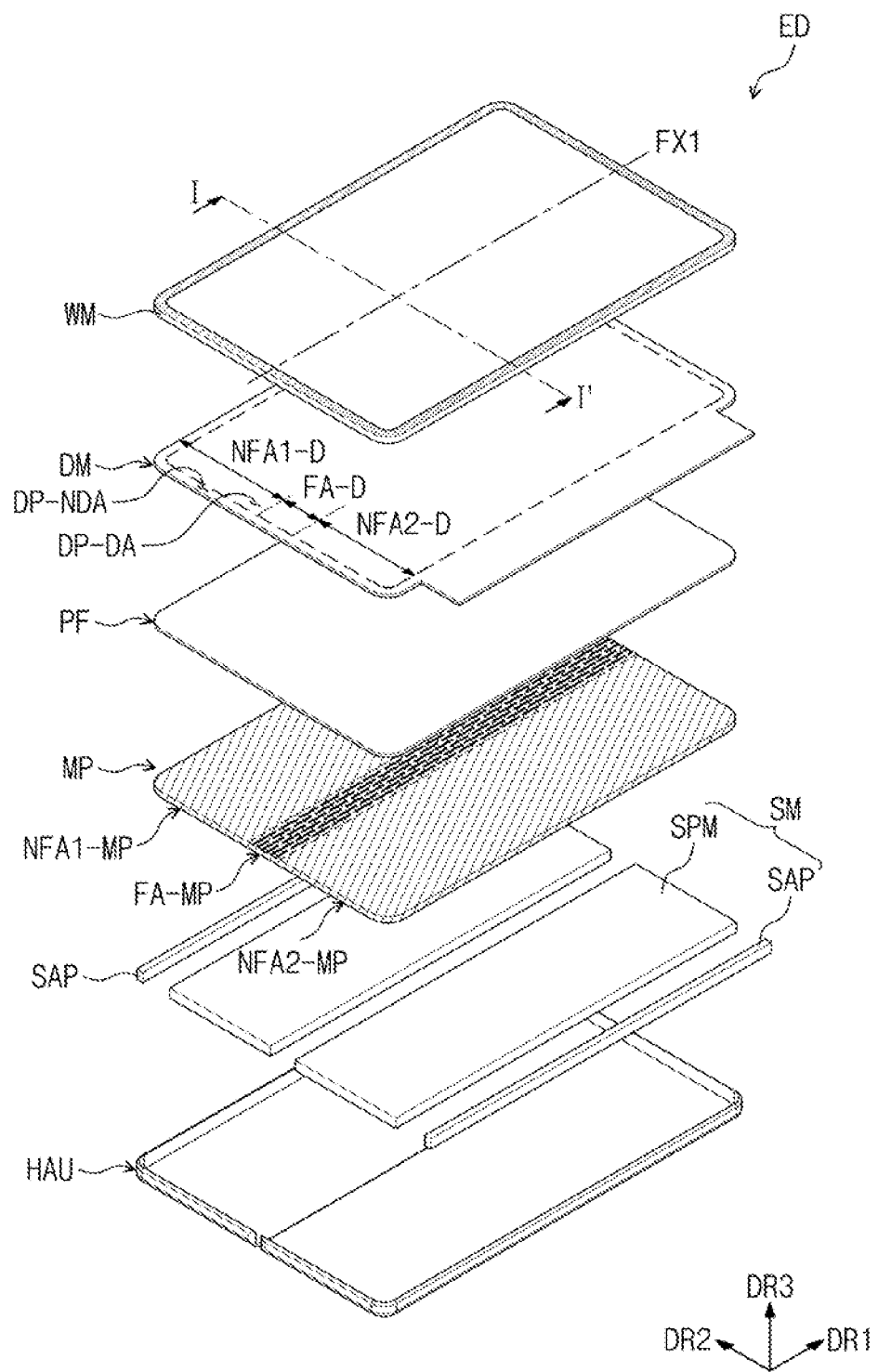
FIG. 3 is an exploded perspective view of a display device according to an embodiment.
Figure 4:
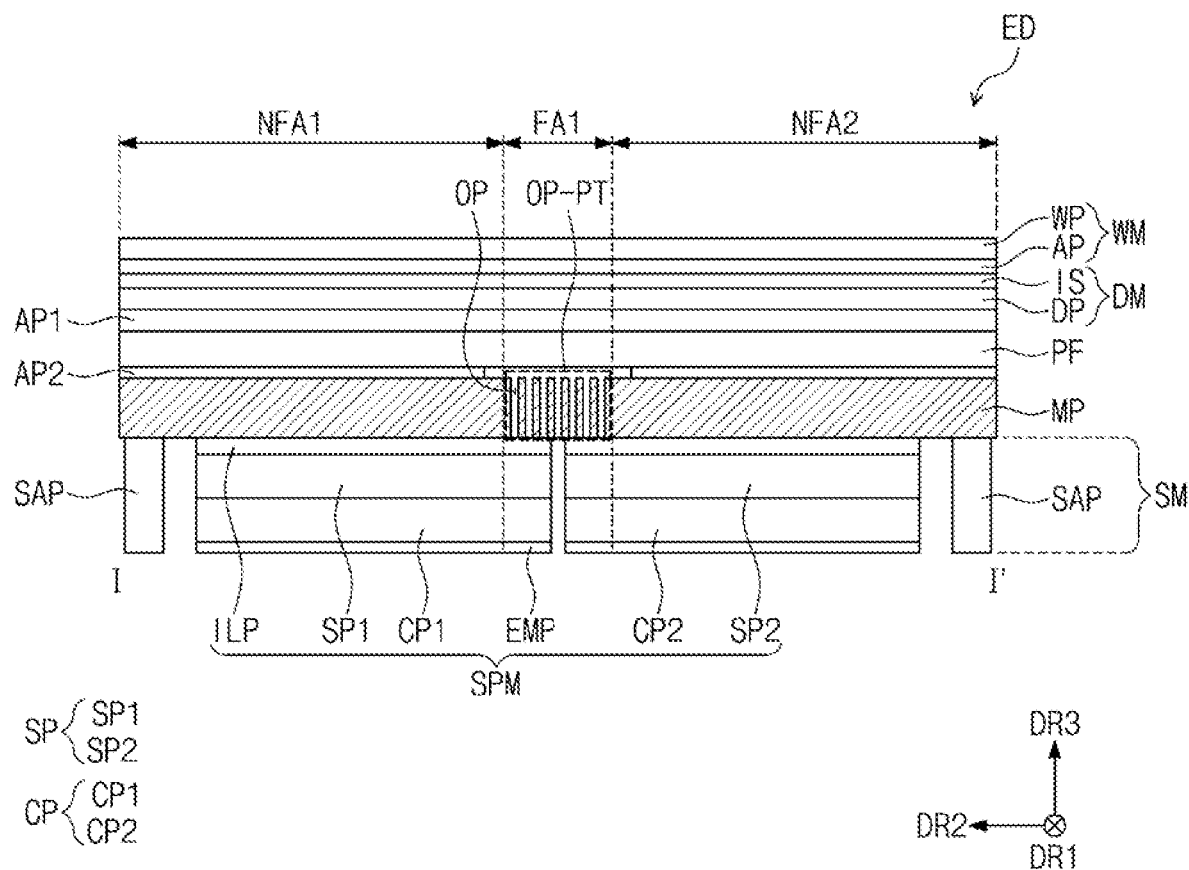
FIG. 4 is a cross-sectional view of an electronic device according to an embodiment.

FIG. 3 is an exploded perspective view of a display device according to an embodiment, and FIG. 4 is a cross-sectional view of an electronic device according to an embodiment. FIG. 3 is an exploded perspective of an electronic device of FIG. 1A according to an embodiment. FIG. 4 is a cross-sectional view that corresponds to a line I-I' of FIG. 3.

Referring to FIGS. 3 and 4, the electronic device ED according to an embodiment includes a display module DM and a support plate MP disposed under the display module DM. The electronic device ED according to an embodiment further includes a lower module SM, and a protective layer PF.

The electronic device ED according to an embodiment also includes a window member WM disposed on the display module DM, and the window member WM covers the entire outside of the display module DM. The window WP has a shape that corresponds to that of the display module DM. In addition, the electronic device ED includes a housing HAU that accommodates the display module DM and the support plate MP. The housing HAU is coupled to the window member WM. In addition, the housing HAU further includes a hinge structure to facilitate folding or bending.

According to an embodiment, the window member WM includes a window WP and an adhesive layer AP. The window WP includes an optically transparent insulating material. The window WP may be a glass substrate or a polymer substrate. For example, the window WP is a reinforced tempered glass substrate.

According to an embodiment, the adhesive layer AP is disposed between the display module DM and the window WP. The adhesive layer AP may be an optically clear adhesive film (OCA) or an optically clear adhesive resin (OCR) layer. In embodiment, the adhesive layer AP is omitted.

According to an embodiment, the display module DM displays an image according to an electrical signal and can transmit or receive information based on an external input. The display module DM includes a display area DP-DA and a non-display area DP-NDA. The display area DP-DA displays the image received from the display module DM.

According to an embodiment, the non-display area DP-NDA is adjacent to the display area DP-DA. For example, the non-display area DP-NDA surrounds the display area DP-DA. However, this is merely an example, and embodiments are not limited thereto. For example, in other embodiments, the non-display area DP-NDA can have various other shapes. According to an embodiment, the display area DP-DA of the display module DM corresponds to at least a portion of the first active area F-AA (see FIG. 1A).

According to an embodiment, the display module DM includes a display panel DP and an input sensor IS disposed on the display panel DP. In addition, the display module DM further includes an optical layer disposed on the input sensor IS. The optical layer can reduce reflection by external light. For example, the optical layer may include a polarizing layer or a color filter layer.

According to an embodiment, the display panel DP includes a base layer, a circuit element layer disposed on the base layer, a display element layer disposed on the circuit element layer, and a thin film encapsulation layer disposed on the display element layer. The base layer includes a polymer material. For example, the base layer includes polyimide.

According to an embodiment, the circuit element layer includes an organic layer, an inorganic layer, a semiconductor pattern, a conductive pattern, and a signal line. The organic layer, the inorganic layer, a semiconductor layer, and a conductive layer are formed on the base layer by methods such as coating, deposition, etc. Thereafter, the organic layer, the inorganic layer, the semiconductor layer, and the conductive layer are selectively patterned through a plurality of photolithography processes to form the semiconductor pattern, the conductive pattern, and the signal line.

According to an embodiment, the display element layer includes a light emitting element. The light emitting element is electrically connected to at least one transistor. The thin film encapsulation layer is disposed on the circuit element layer to seal the display element layer. The thin film encapsulation layer includes an inorganic layer, an organic layer, and an inorganic layer that are sequentially laminated. The lamination structure of the thin film encapsulation layer is not particularly limited.

According to an embodiment, the input sensor IS includes a plurality of sensing electrodes that can sense external inputs. The input sensor IS may be a capacitive sensor, but embodiments are not particularly limited thereto. When manufacturing the display panel DP, the input sensor IS is directly formed on the thin film encapsulation layer through a continuous process. However, embodiments of the inventive concept are not limited thereto, and the input sensor IS may be provided as a separate panel from the display panel DP and may be attached to the display panel DP by an adhesive layer.

According to an embodiment, the display module DM includes a foldable display part FA-D and non-foldable display parts NFA1-D and NFA2-D. The foldable display part FA-D corresponds to the foldable area FA1 (see FIG. 1A), and the non-foldable display parts NFA1-D and NFA2-D correspond to the non-foldable areas NFA1 and NFA2 (see FIG. 1A).

According to an embodiment, the foldable display part FA-D can be folded or bent with respect to the first folding axis FX1. The display module DM includes a first non-foldable display part NFA1-D and a second non-foldable display part NFA2-D, and the first non-foldable display pan NFA1-D and the second non-foldable display part NFA2-D are spaced apart from each other in the second direction DR2 with the foldable display part FA-D located therebetween.

According to an embodiment, the support plate MP is disposed below the display module DM. In an embodiment, the support plate MP includes a metal or a polymer. For example, the support plate MP is made of one of stainless steel, aluminum, or an alloy thereof. Alternatively, the support plate MP is made of a polymer.

According to an embodiment, a plurality of openings OP are formed in the support plate MP. The support plate MP includes an opening pattern OP-PT that includes the plurality of openings OP.

According to an embodiment, a thickness of the support plate MP varies in consideration of mechanical design characteristics of the electronic device ED and mechanical properties of the electronic device ED. For example, the thickness of the support plate MP is about 150 μm, but embodiments are not limited thereto.

Referring to FIGS. 3 and 4, according to an embodiment, the protective layer PF is disposed between the display module DM and the support plate MP. The protective layer PF is disposed below the display module DM to protect a rear surface of the display module DM. The protective layer PF overlaps the entire display module DM. The protective layer PF includes a polymer. For example, the protective layer PF may be a polyimide film or a polyethylene terephthalate film. However, embodiments are not limited thereto, and the material of the protective layer PF may vary in other embodiments.

The electronic device ED according to an embodiment furthers includes a lower module SM. The lower module SM includes a support member SPM and a charging part SAP. The support member SPM overlaps most areas of the display module DM. The charging part SAP is disposed outside the support member SPM and overlaps an outer periphery of the display module DM.

According to an embodiment, the lower module SM includes at least one of a support layer SP or a cushion layer CP. In addition, the lower module SM further includes at least one of a shielding layer EMP and an interlayer bonding layer ILP.

For example, according to an embodiment, the support layer SP includes a metal or a polymer. The support layer SP is disposed below the support plate MP. The support layer SP is a thin metal substrate. When the support layer SP is a thin metal substrate, the support layer SP may include stainless steel, aluminum, or an alloy thereof. The support layer SP can dissipate heat or shield against electromagnetic radiation.

In an embodiment illustrated in FIG. 4, the cushion layer CP is disposed below the support layer SP. The cushion layer CP prevents the support plate MP from being pressed and deformed due to external impacts and force. The cushion layer CP improves impact resistance of the electronic device ED. The cushion layer CP may include a sponge, foam, or an elastomer such as a urethane resin. In addition, the cushion layer CP includes at least one of an acrylic-based polymer, a urethane-based polymer, a silicon-based polymer, or an imide-based polymer. However, embodiments of the inventive concept are not limited thereto.

In FIG. 4 and other drawings, the cushion layer CP is disposed below the support layer SP, but embodiments are not limited thereto. For example, in other embodiments, the cushion layer CP is disposed above the support layer SP.

In the electronic device ED according to an embodiment, a configuration of the lower module SM varies depending on a size and shape of the electronic device ED or operation characteristics of the electronic device ED. For example, in an embodiment, the lower module SM includes a plurality of support layers SP or includes a plurality of cushion layers CP. In addition, in an embodiment, one of the support layer SP or the cushion layer CP is omitted from the lower module SM, so that the lower module SM includes only the support layer SP or only the cushion layer CP.

According to an embodiment, the support layer SP includes a first sub-support layer SP1 and a second sub-support layer SP2 that are spaced apart from each other in the second direction axis DR2. The first sub-support layer SP1 and the second sub-support layer SP2 are spaced apart from each other by a portion that corresponds to the first folding axis FX1. A gap is formed between the first sub-support layer SP1 and the second sub-support layer SP2 at the first folding axis FX1. The support layers SP are spaced apart from each other at the foldable area FA1 and are thus provided as the first sub-support layer SP1 and the second sub-support layer SP2 to improve the folding or bending characteristics of the electronic device ED.

In addition, according to an embodiment, the cushion layer CP includes a first sub-cushion layer CP1 and a second sub-cushion layer CP2 that are spaced apart from each other in the second direction axis DR2. The first sub-cushion layer CP1 and the second sub-cushion layer CP2 are spaced apart from each other at a portion that corresponds to the first folding axis FX1. A gap is formed between the first sub-cushion layer CP1 and the second sub-cushion layer CP2 at the first folding axis FX1. The gap between the first sub-cushion layer CP1 and the second sub-cushion layer CP2 corresponds to the gap between the first sub-support layer SP1 and the second sub-support layer SP2. The cushion layers CP are spaced apart from each other at the foldable area FA1 and are thus provided as the first sub-cushion layer CP1 and the second sub-cushion layer CP2 to improve the folding or bending characteristics of the electronic device ED. The locations of the first sub-cushion layer CP1 and the second sub-cushion layer CP2 respectively correspond to that of the first sub-support layer SP1 and the second sub-support layer SP2.

According to an embodiment, the lower module SM further includes the shielding layer EMP. The shielding layer EMP is an electromagnetic shielding layer or a heat dissipating layer. In addition, the shielding layer EMP can function as a bonding layer. The lower module SM and the housing HAU are coupled to each other by the shielding layer EMP. FIG. 4 and other drawings show the shielding layer EMP as being disposed below the cushion layer CP, but embodiments are not limited thereto.

According to an embodiment, the lower module SM further includes the interlayer bonding layer ILP disposed below the support plate MP. The interlayer bonding layer ILP bonds the support plate MP to the lower module SM. The interlayer bonding layer ILP has the form of a bonding resin layer or an adhesive tape. The interlayer bonding layer ILP overlaps the entire foldable display part FA-D. However, embodiments are not limited thereto, and in other embodiments, a portion that overlaps the foldable display part FA-D is removed.

According to an embodiment, the charging part SAP is disposed outside the support layer SP and the cushion layer CP. The charging part SAP is disposed between the support plate MP and the housing HAU. The charging part SAP fills a space between the support plate MP and the housing HAU and fixes the support plate MP.

In addition, the electronic device ED according to an embodiment further includes at least one of an adhesive layer AP1 or AP2. For example, the first adhesive layer AP1 is disposed between the display module DM and the protective layer PF, and the second adhesive layer AP2 is disposed between the protective layer PF and the support plate MP. At least one of the adhesive layers AP1 or AP2 is an optically clear adhesive film (OCA) or an optically clear adhesive resin layer (OCR). However, embodiments are not limited thereto, and in other embodiments, at least one of the adhesive layer AP1 or AP2 has a transmittance of about 80% or less.

In addition, the electronic device ED according to an embodiment further includes an adhesive layer disposed between the support layer SP and the cushion layer CP.

In addition, although FIG. 3 and other drawings illustrate a case in which the folding axis FX1 is parallel to the long side of the electronic device ED, embodiments are not limited thereto. For example, in an electronic device according to another embodiment, the folding axis is parallel to the short side of the electronic device.

Figure 6:
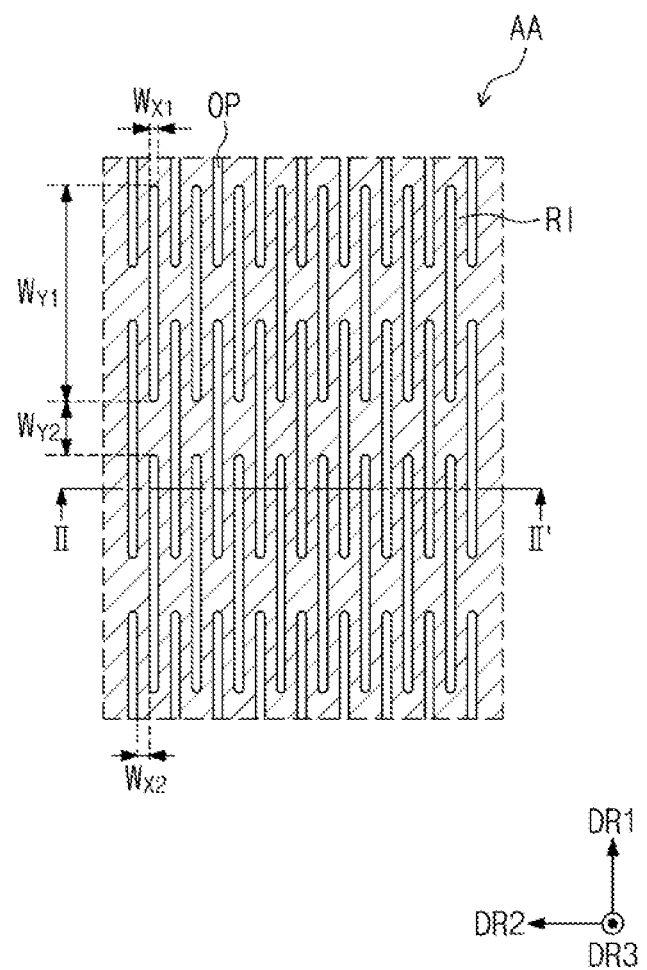
FIG. 6 is a plan view of a portion of a support plate according to an embodiment.

FIG. 5 is a perspective view of a support plate according to an embodiment. FIG. 6 is an enlarged plan view of an area "AA" of FIG. 5.

Referring to FIGS. 5 and 6, the support plate MP according to an embodiment includes a foldable part FA-MP and non-foldable parts NFA1-MP and NFA2-MP. The foldable part FA-MP corresponds to the foldable area FA1 (see FIG. 1A), and the non-foldable parts NFA1-MP and NFA2-MP correspond to the non-foldable areas NFA1 and NFA2 (see FIG. 1A). The foldable part FA-MP of the support plate MP overlaps the foldable display part FA-D (see FIG. 3), and the non-foldable parts NFA1-MP and NFA2-MP of the support plate MP overlap the non-foldable display parts NFA1-D and NFA2-D (see FIG. 3).

According to an embodiment, the foldable part FA-MP can be folded or bent with respect to the first folding axis FX1. The first non-foldable part NFA1-MP and the second non-foldable part NFA2-MP are spaced apart from each other in the second direction DR2 with the foldable part FA-MP located therebetween.

According to an embodiment, a plurality of openings OP are formed in the foldable part FA-MP of the support plate MP. When viewed on a plane defined by the first and second direction axes DR1 and DR2, a width $W_{Y1}$ of each of the openings OP in the first direction DR1 is greater than a width $W_{X1}$ of each of the opening OP in the second direction DR2. The width $W_{Y1}$ of the opening in the first direction DR1 parallel to the folding axis FX1 is greater than the width $W_{X1}$ of the opening in the second direction DR2 perpendicular to the folding axis FX1.

For example, in an embodiment, the opening width $W_{Y1}$ in the first direction DR1 is about 5.50 mm, and the opening width $W_{X1}$ in the second direction DR2 may be about 0.15 mm. However, this is merely an example, and embodiments are not limited thereto. For example, in other embodiments, the width of the opening varies according to the required mechanical properties and flexibility.

In addition, according to an embodiment, the foldable part FA-MP of the support plate MP includes a support part RI disposed between the adjacent openings OP. The support part RI corresponds to a lip portion that remains after the openings OP are formed. The openings OP are defined by the support parts RI.

In an embodiment, a width $W_{Y2}$ of the support part RI in the first direction DR1 is greater than that of the support part RI in the second direction DR2. For example, in one embodiment, the width $W_{Y2}$ of the support part RI in the first direction DR1 is about 0.20 mm, and the width $W_{X2}$ of the support part RI in the second direction DR2 is about 0.10 mm. However, this is merely an example, and embodiments are not limited thereto. For example, in other embodiments, the width of the openings varies according to the required mechanical properties and flexibility. The width $W_{Y2}$ of the support part RI in the first direction DR1 corresponds to the spacing between openings OP in the first direction DR1, and the width $W_{X2}$ of the support part RI in the second direction DR2 corresponds to the spacing between openings OP in the second direction DR2.

In an embodiment, the number of openings OP formed in the foldable part FA-MP of the support plate MP, the size of each of the openings OP, and the shape of each of the openings OP varies in consideration of mechanism design characteristics of the electronic device ED, mechanical properties of the electronic device ED, and folding characteristics of the foldable area, and are not limited to those shown in the present specification.

In an embodiment, the first non-foldable part NFA1-MP and the second non-foldable part NFA2-MP are spaced apart from each other with the foldable part FA-MP, which can be folded with respect to the first folding axis FX1, located therebetween. An angle between an extension surface IMA1 of the first non-foldable part NFA1-MP and an extension surface IMA2 of the second non-foldable part NFA2-MP is greater than or equal to about 120° and less than or equal to about 180°. That is, a bent angle $\theta_{FA}$ of the support plate MP based on the foldable part FA-MP is greater than or equal to about 120° and less than or equal to about 180°. The bent angle $\theta_{FA}$ is defined between the virtual extension surfaces IMA1 and IMA2 of each of the first non-foldable part NFA1-MP and the second non-foldable part NFA2-MP. According to an embodiment, the bent angle $\theta_{FA}$ corresponding to the angle between the first non-foldable part NFA1-MP and the second non-foldable part NFA2-MP has a value of about 120° or more and about 180° or less, and thus, the support plate MP exhibits good flatness characteristics.

The support plate MP according to an embodiment will be described in more detail below.

Hereinafter, a method for manufacturing a support plate according to an embodiment will be described with reference to FIGS. 7 to 18.

Figure 7:
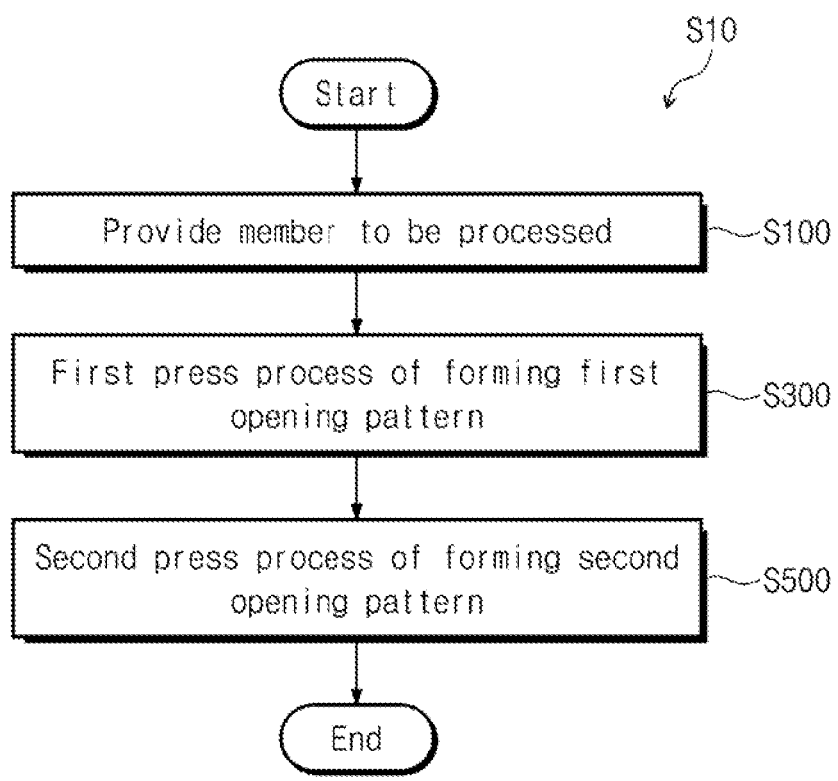
FIG. 7 is a flowchart illustrating a method for manufacturing a support plate according to an embodiment.
Figure 8:
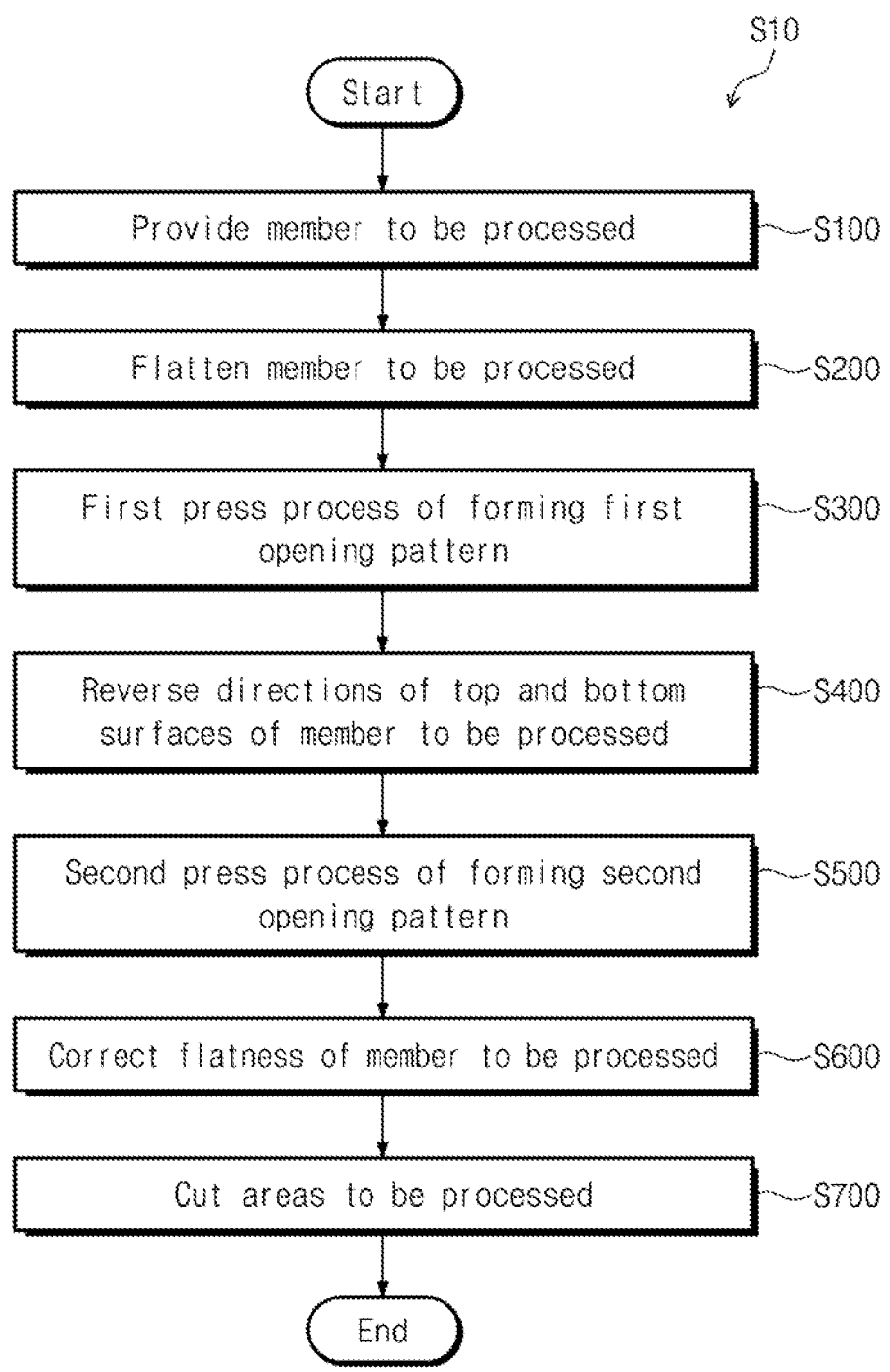
FIG. 8 is a flowchart of a method for manufacturing a support plate according to an embodiment.
Figure 9:
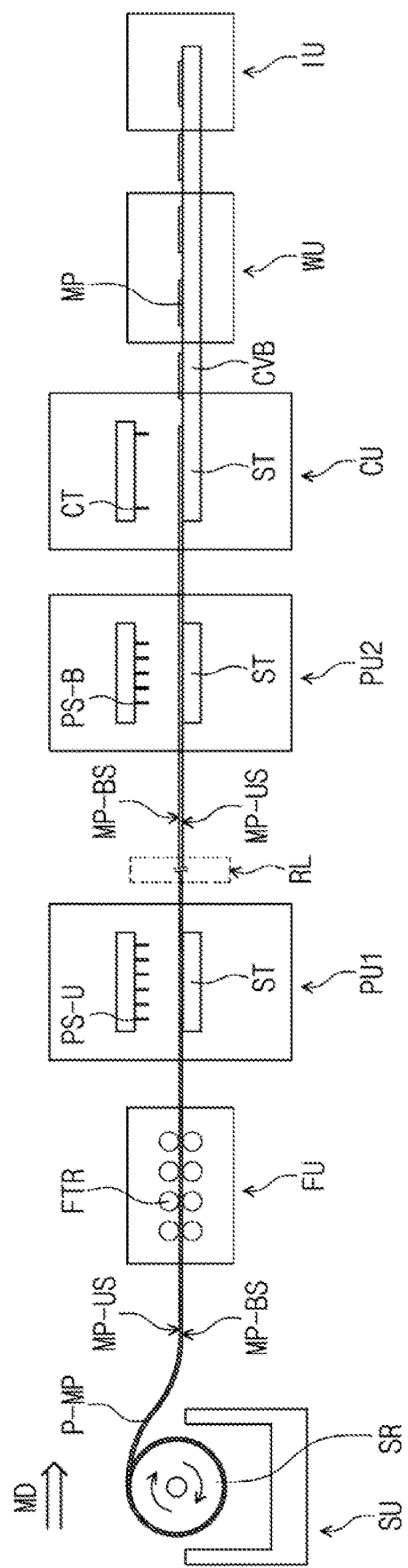
FIG. 9 illustrates processes of a method for manufacturing a support plate according to an embodiment.

FIGS. 7 and 8 are flowcharts of a method for manufacturing a support plate according to an embodiment. FIG. 9 is a schematic view that illustrates a method for manufacturing a support plate according to an embodiment.

A method (S10) for manufacturing a support plate according to an embodiment includes a process (S100) of providing a member to be processed, hereinafter referred to as a processed member, a first press process (S300) that forms a first opening pattern, and a second press process (S500) that forms a second opening pattern.

In an embodiment, the process (S100) of providing the processed member includes providing a processed member P-MP to a supply unit SU. The supply unit SU includes a supply roller SR on which a base roll for the processed member P-MP is mounted. The processed member P-MP is displaced in a machine direction MD due to a rotation of the supply roller SR. The machine direction MD is a direction in which processing processes of the processed member proceeds and is a direction in which the base roll for the processed member P-MP is unwound.

Figure 10:
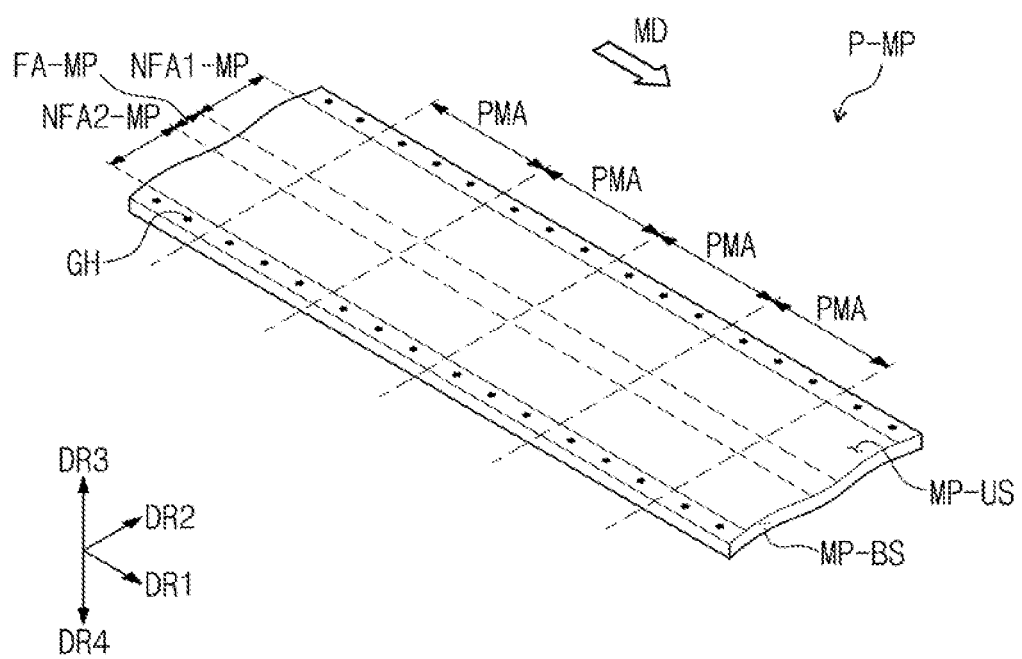
FIG. 10 illustrates a process of providing a member to be processed, according to an embodiment.

FIG. 10 illustrates process (S100) of providing the processed member, according to an embodiment. Referring to FIG. 10, the processed member P-MIP includes a top surface MP-US and a bottom surface MP-BS that face each other. In addition, the processed member P-MP includes a foldable part FA-MP and non-foldable parts NFA1-MP and NFA2-MP. Process (S100) of providing the processed member includes a process of providing the processed member P-MP.

According to an embodiment, the processed member P-MP extends in one direction. Referring to FIG. 10, the processed member P-MP extends in the machine direction MD, which is one direction. The processed member P-MP includes a plurality of areas PMA to be processed, hereinafter referred to as processed areas, which are adjacent to each other, in the machine direction MD. Each of the plurality of processed areas PMA includes a foldable part FA-MP and non-foldable parts NFA1-MP and NFA2-MP. Each of the processed areas PMA is processed into one support plate MP (see FIG. 5).

According to an embodiment, the processed member P-MP may include a metal or a polymer. In an embodiment, the processed member P-MP includes at least one of stainless steel, aluminum, or a polymer resin. For example, the processed member P-MP includes stainless steel, aluminum, or an alloy thereof.

According to an embodiment, a guide hole GH is formed outside the processed member P-MP. The guide hole GH senses a position of the processed member P-MP in the support plate processing process or guides an arrangement of the processed members P-MP in a manufacturing facility. In an embodiment, the guide hole GH passes through the processed member P-MP from the top surface MP-US to the bottom surface MP-BS. However, embodiments are not limited thereto. For example, in other embodiments, the guide hole GH penetrates into the processed member P-MP from the top surface MP-US but does not extend through to the bottom surface MP-BS, or the guide hole GH penetrates into the processed member P-MP from the bottom surface MP-BS but does not extend through to the top surface MP-US. In an embodiment, a plurality of guide holes are formed on both sides of the processed member P-MP.

Referring again to FIGS. 7 to 9, the method (S10) for manufacturing a support plate according to an embodiment includes steps of pressing the provided processed member. The method (S10) of manufacturing a support plate according to an embodiment include a first press process (S300) that forms a first opening pattern and a second press process (S500) that forms a second opening pattern.

In addition, referring to FIG. 8, according to an embodiment, the method (S10) for manufacturing a support plate according to an embodiment further include a (S200) of flattening the processed member before the first press process (S300). Process (S200) of flattening the processed member is performed before the first press process (S300). Process (S200) of flattening the processed member is performed in a flattening unit FU that including flattening rolls FTR. The processed member P-MP received from the supply unit SU includes a curved portion and is supplied to the flattening unit FU in which the curved portion is flattened by passing between the flattening rolls FTR.

In an embodiment, the processed member P-MP may be directly supplied from the supply unit SU to a first press unit PU1 or may be provided from the supply unit SU to the flattening unit FU and then be processed in the first press unit PU1.

In an embodiment, the first press process (S300) forms a first opening pattern in the foldable part by using a first press in the direction of the top surface MP-US of the processed member P-MP. The processed member P-MP received from the supply unit SU is provided to the first press unit PU1. The first press unit PU1 includes a support substrate ST on which the processed member P-MP is placed, and a first press PS-U that processes the processed member P-MP.

Referring to FIG. 9, in an embodiment, the bottom surface MP-BS of the processed member is placed on the support substrate ST, and the first press PS-U is disposed on the top surface MP-US of the processed member.

Figure 11A:
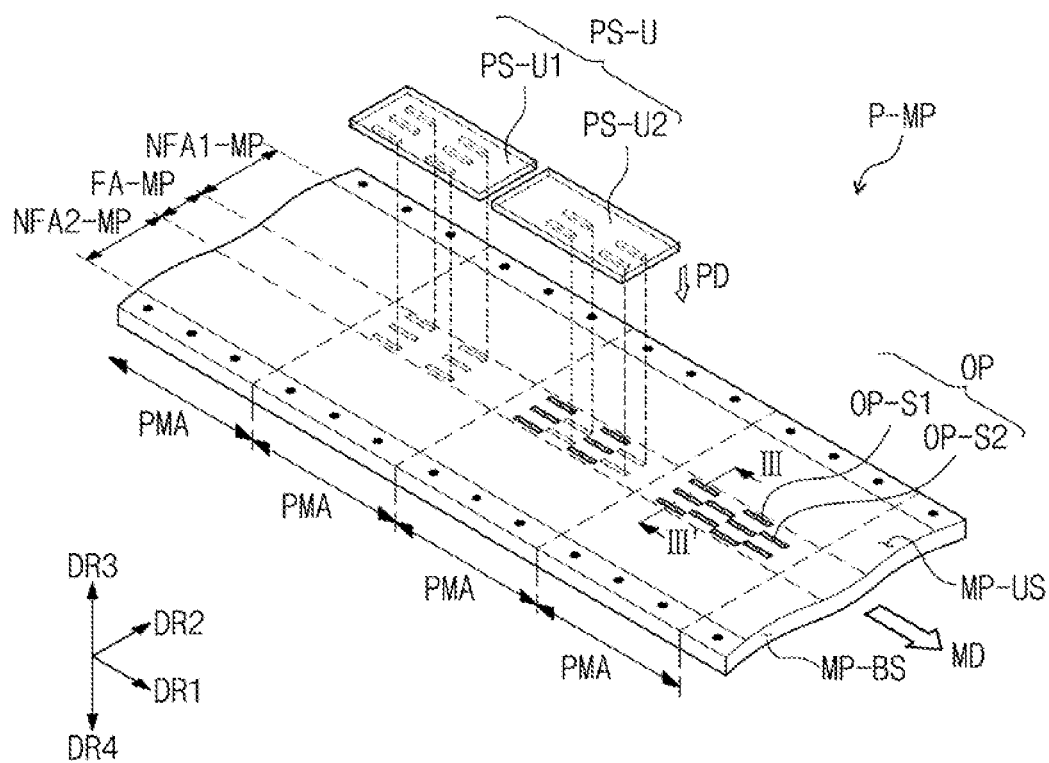
FIG. 11A illustrates a first press process, according to an embodiment.
Figure 11B:
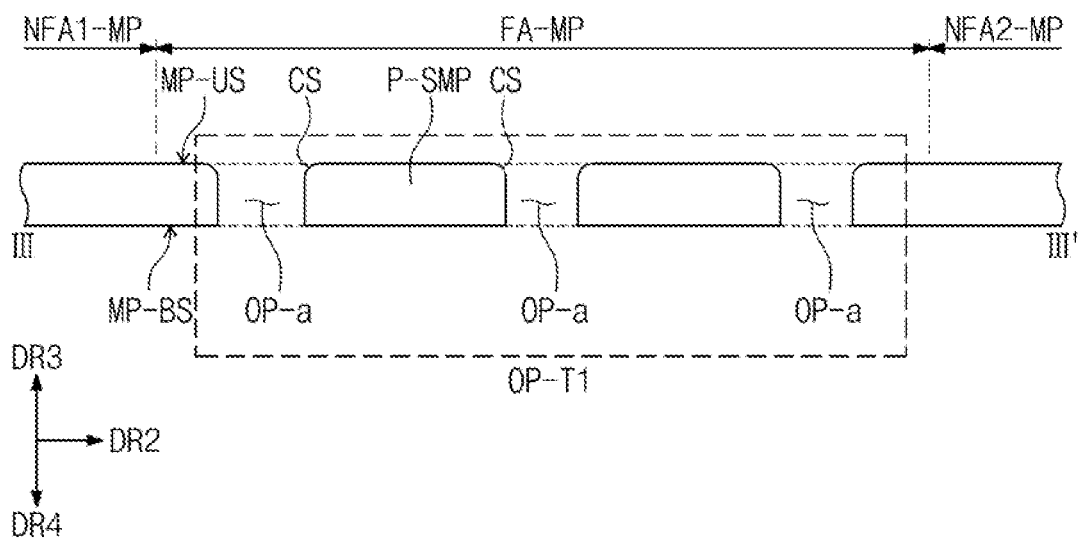
FIG. 11B is a cross-sectional view of a member to be processed after the first press process, according to an embodiment.

FIG. 11A illustrates the first press process (S300) that forms the first opening pattern. FIG. 11B is a cross-sectional view of the support plate after the first press process (S300).

Referring to FIGS. 9, 11A, and 11B, in an embodiment, the first press process (S300) forms a first opening pattern OP-PT1 in the foldable part FA-MP by using the first press PS-U in the direction of the top surface MP-US of the processed member P-MP.

In an embodiment, the first opening pattern OP-PT1 includes openings OP-a that pass through the processed member P-MP from the top surface MP-US to the bottom surface MP-BS and a plurality of preliminary support parts P-SMP spaced apart from each other with the openings OP-a therebetween. Each of the preliminary support parts P-SMP include a curved edge CS on the top surface MP-US adjacent to one of the openings OP-a. The curved edge CS of each of the preliminary support parts P-SMP formed during the processing using the first press PS-U.

In an embodiment, the first press PS-U includes a first sub-press PS-U1 that forms first openings OP-S1 and a second sub-press PS-U2 that forms second openings OP-S2 that do not overlap the first openings OP-S1. The first press PS-U operates in a press direction PD in a direction of the fourth direction axis DR4 that is opposite to the third direction DR3 toward the top surface MP-US of the member P-MP.

In an embodiment, the first sub-press PS-U1 and the second sub-press PS-U2 are sequentially arranged in the machine direction MD. In addition, the first press PS-U further includes a plurality of sub-presses sequentially arranged in addition to the first sub-press PS-U1 and the second sub-press PS-U2. The plurality of sub-presses units are sequentially arranged in the machine direction MD, and each of the sub-presses are arranged to correspond to each of the adjacent processed areas PMA. As the processed member P-MP moves in the machine direction MD, one processed area PMA is sequentially processed by the first sub-press PS-U1 and the second sub-press PS-U2.

In an embodiment, a plurality of openings are formed by the plurality of sub-press units. The plurality of openings may be formed between at least one of the first opening OP-S1 or the second opening OP-S2 in the first direction DR1 or between at least one of the first opening OP-S1 or the second opening OP-S2 in the second direction DR2.

In addition, in an embodiment, the first press PS-U includes a plurality of sub-presses adjacent to each other in the second direction DR2. In this case, a width of each of the adjacent sub-presses in the second direction DR2 is less than that of the foldable part FA-MP in the second direction DR2, and a total width of the adjacent sub-presses corresponds to that of the foldable part FA-MP in the second direction DR2. The adjacent sub-presses correspond to each other within the one processed area PMA. The adjacent sub-presses may simultaneously pattern one processed area PMA or sequentially pattern different portions of one processed area PMA.

In an embodiment, FIGS. 11A and 11B, in an embodiment, two preliminary support parts P-SMP are shown as being formed in the first press process, but this is merely an example for convenience of description. In other embodiments, the first opening pattern OP-PT1 includes three or more preliminary support parts P-SMP.

The first opening pattern formed by the first press is not limited to the above arrangement, and the first opening pattern may include various openings formed by the first press PS-U disposed on the top surface of the processed member. The first opening pattern may be differently formed depending on the number of openings, the shape of each of the openings, and the arrangement of the openings in the support plate that is finally used in the electronic device.

In an embodiment, the first opening pattern OP-PT1 includes a preliminary support part P-SMP that includes a curved portion CS at an edge of the top surface and is formed by pressing the first press PS-U through the processed member P-MP from the top surface MP-US to the bottom surface MP-BS.

Figure 12A:
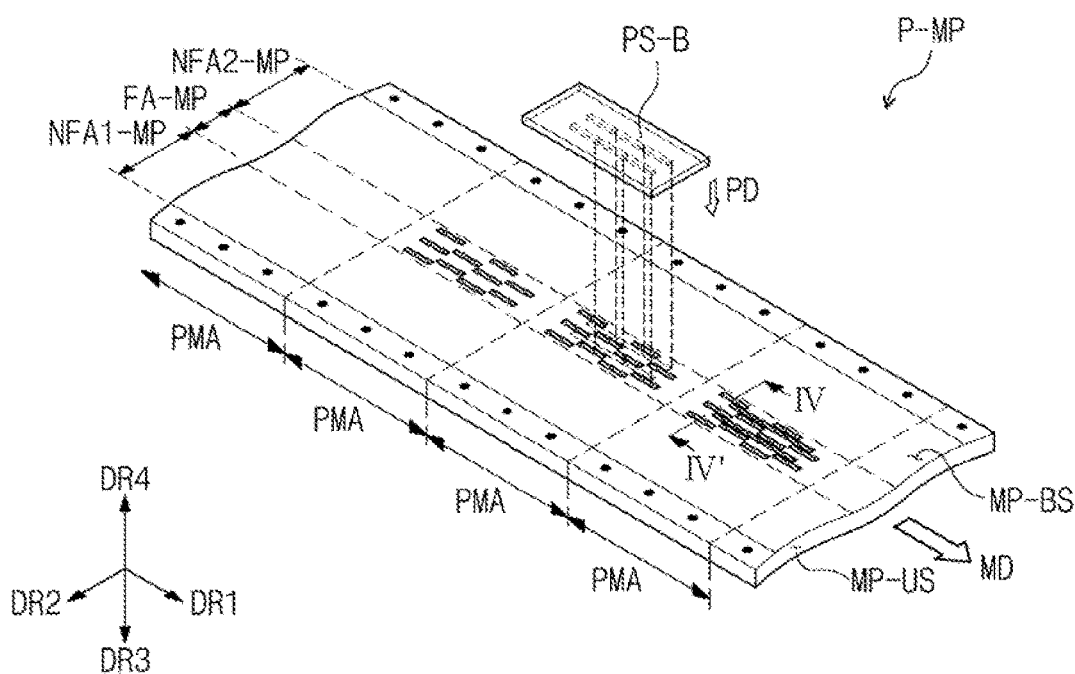
FIG. 12A illustrates a second press process, according to an embodiment.
Figure 12B:
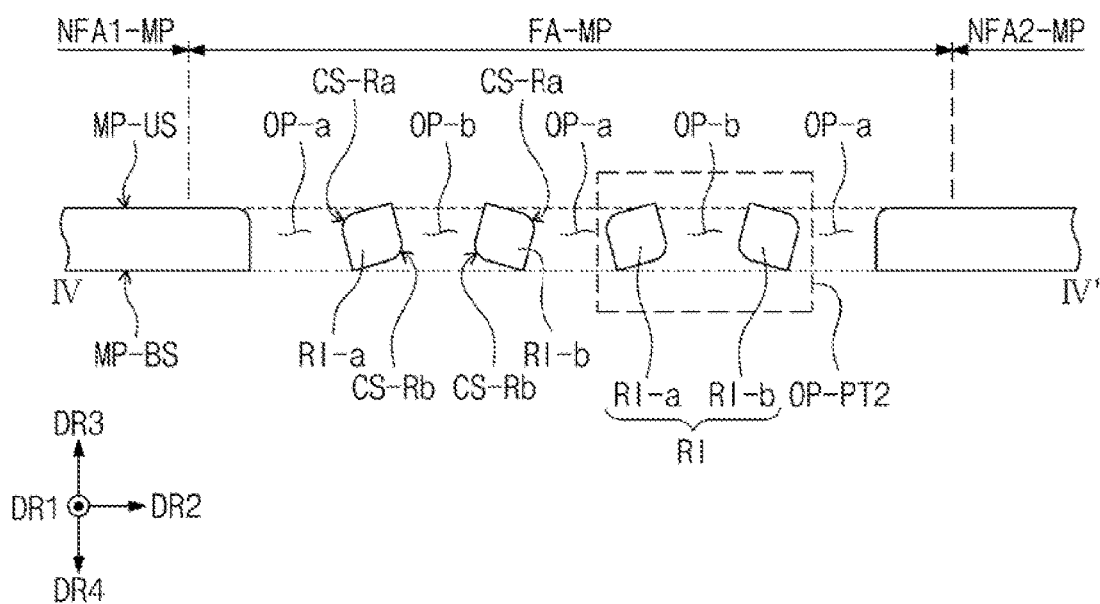
FIG. 12B is a cross-sectional view of a member to be processed after a second press process, according to an embodiment.

The method of manufacturing a support plate according to an embodiment includes a second press process (S500) that forms a second opening pattern. FIG. 12A illustrates the second press process (S500) that forms the second opening pattern. FIG. 12B is a cross-sectional view of the support plate after the second press process (S500).

Referring to FIGS. 9, 12A, and 12B, in a method for manufacturing the support plate according to an embodiment, the processed member P-MP received from the first press unit PU1 is provided to a second press unit PU2. The second press unit PU2 includes a support substrate ST, on which the processed member P-MP is placed, and a second press PS-B that processes the processed member P-MP. The second press process (S500) that forms the second opening pattern forms a second opening pattern OP-PT2 in the foldable part FA-MP by using the second press PS-B in a direction of the bottom surface MP-BS of the processed member P-MP. The second press process (S500) patterns at least one of the preliminary support parts P-SMP in the first opening pattern OP-PT1 formed in the first press process (S300) by using the second press PS-B.

In a process according to an embodiment of patterning by using the second press PS-B, openings OP-b are formed in at least one of the preliminary support parts P-SMP. In addition, the first support parts RI are formed by patterning using the second press PS-B. In an embodiment, each of the first support parts RI includes a first curved edge CS-Ra at one side of the top surface and a second curved edge CS-Rb at one side of the bottom surface and that faces the first curved edge CS-Ra in a diagonal direction.

In an embodiment, the second opening pattern OP-PT2 includes the openings OP-b that passes through the processed member P-MP from the top surface MP-US to the bottom surface MP-BS, and a plurality of support parts RI spaced apart from each other with the openings OP-b therebetween. The openings OP-b in the second opening pattern OP-PT2 are formed by using the second press PS-B to penetrate through the processed member P-MP from the bottom surface MP-BS to the top surface MP-US.

That is, in an embodiment, the second opening pattern OP-PT2 is formed by processing the processed member in a direction opposite to that used to form the first opening pattern OP-PT1. The opening OP-b in the second opening pattern OP-PT2 are formed in a separate process from that used to form the opening OP-a in the first opening pattern OP-PT1 (see FIG. 11B). The openings OP-a in the first opening pattern OP-PT1 (see FIG. 11B) are formed by using the first press PS-U to penetrate the processed member P-MP from the top surface to the bottom surface, and the openings OP-b in the second opening pattern OP-PT2 are formed by using the second press PS-B to penetrate the processed member P-MP from the bottom surface to the top surface.

In an embodiment, the second press PS-B is disposed on the bottom surface MP-BS of the processed member P-MP. The second opening pattern OP-PT2 is formed by the second press PS-B being inserted into the bottom surface MP-BS of the processed member P-MP.

Referring to FIG. 9 and other drawings, according to an embodiment, the top surface MP-US of the processed member P-MP supplied to the second press unit PU2 is mounted on the support substrate ST, and the second press PS-B is disposed on the bottom surface MP-BS of the processed member. The processed member P-MP processed by the first press unit PU1 is supplied to the second press unit PU2 in a state in which the top surface MP-US and the bottom surface MP-BS are reversed.

Referring to FIG. 8, the method (S10) for manufacturing the support plate according to an embodiment includes a process (S400) of reversing the directions of the top and bottom surfaces of the processed member between the first press process (S300) and the second press process (S500). A reversing part RL is disposed between the first press unit PU1 and the second press unit PU2. The reversing part RL overturns the processed surface of the member P-MP. The reversing part RL may be a separate member of an embodiment, but embodiments are not limited thereto. In the reversing part RL, the top surface MP-US and the bottom surface MP-BS of the processed member P-MP in addition to the guide roll (not shown) are gradually reversed while advancing in the machine direction MD.

Referring again to FIGS. 12A and 12B, according to an embodiment, FIG. 12A and other drawings illustrate one second press PS-B, but embodiments are not limited thereto. For example, in other embodiments, the second press PS-B includes a plurality of sub-presses. When the second press PS-B includes a plurality of sub-presses, as illustrated in FIG. 11A, the plurality of sub-presses are sequentially arranged in the machine direction MD to correspond to each of the processed areas PMA. In this case, the plurality of sub-presses included in the second press PS-B sequentially process the processed areas PMA.

Alternatively, in other embodiments, the second press PS-B includes a plurality of sub-presses adjacent to each other in the second direction DR2. In this case, the adjacent sub-presses may simultaneously pattern one processed area PMA or sequentially pattern different portions of one processed area PMA.

Referring to FIG. 12B, according to an embodiment, the first support parts RI in the second opening pattern OP-PT2 include a first sub-support part RI-a and a second sub-support part RI-b. which are adjacent to each other with the opening OP-b therebetween. The first sub-support part RI-a and the second sub-support part RI-b define the openings OP-b formed by the second press PS-B. The top surfaces of the first and second sub-support parts RI-a and RI-b are inclined with respect to a plane defined by the first and second directions DR1 and DR2. The inclined directions of the top surfaces of the first and second sub-support parts RI-a and RI-b differ from each other. The top surface of the first sub-support parts RI-a is inclined with respect to the plane defined by the first and second direction axes DR1 and DR2 in a direction that is opposite to the inclination of the top surface of the second sub-support parts RI-b with respect to the plane defined by the first and second direction axes DR1 and DR2.

A support plate manufactured by the method (S10) for manufacturing a support plate according to an embodiment includes both the first press process step of processing the processed member from the top surface of the processed member and the second press process step of processing the processed member from the bottom surface of the processed member to improve flatness of the opening pattern that is finally formed.

Figure 13A:
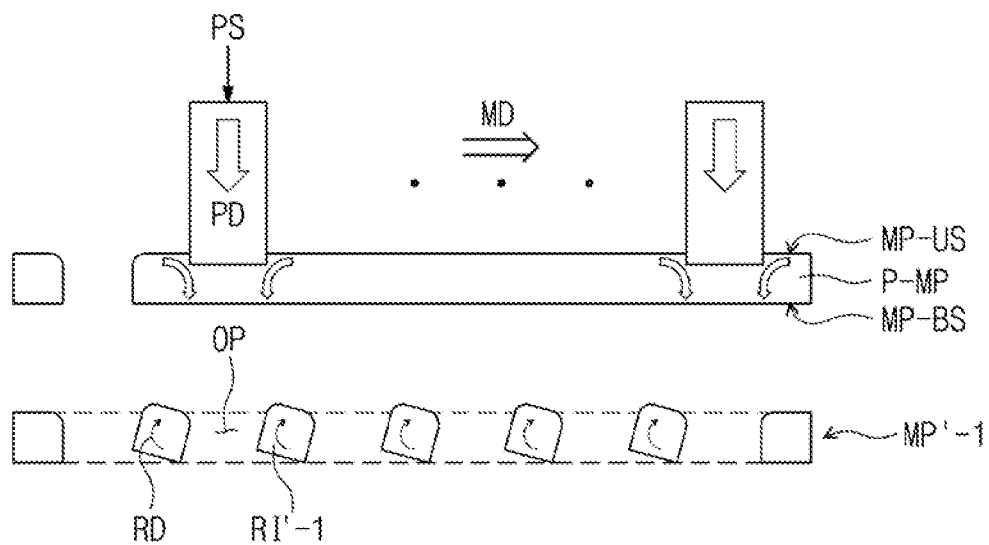
FIGS. 13A and 13B illustrate a method for manufacturing a support plate according to a related art.
Figure 13B:
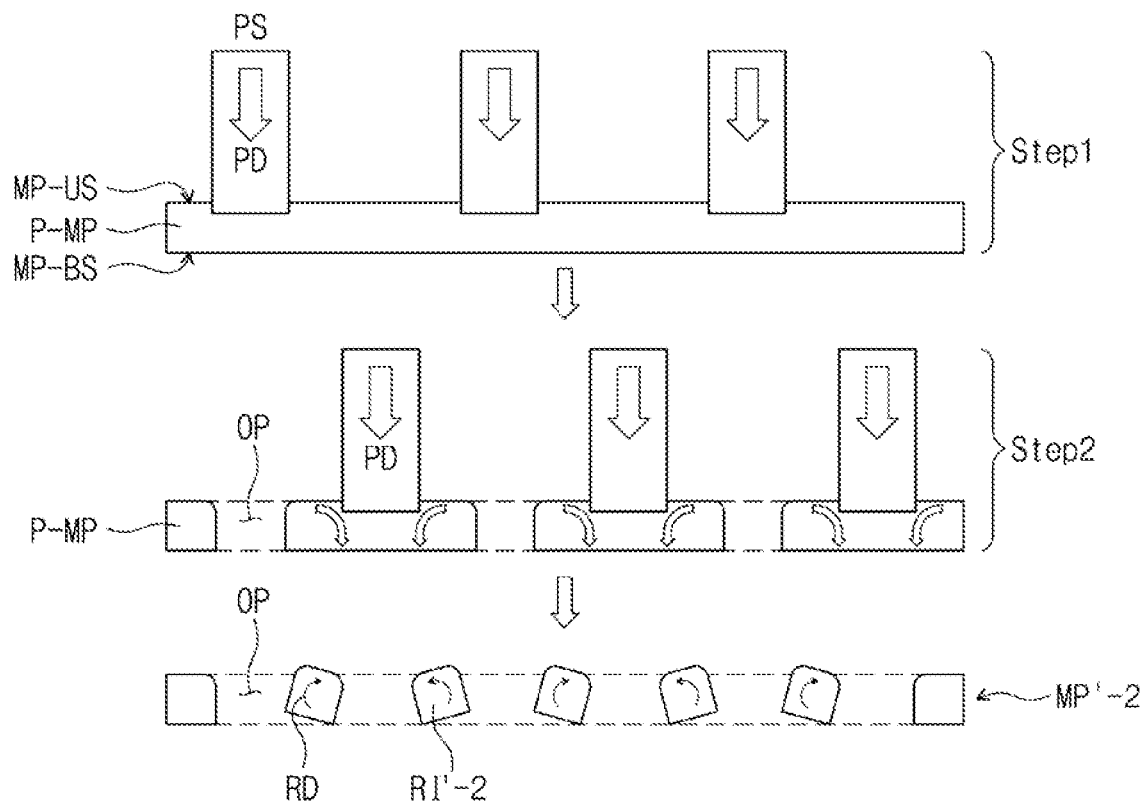
Figure 13C:
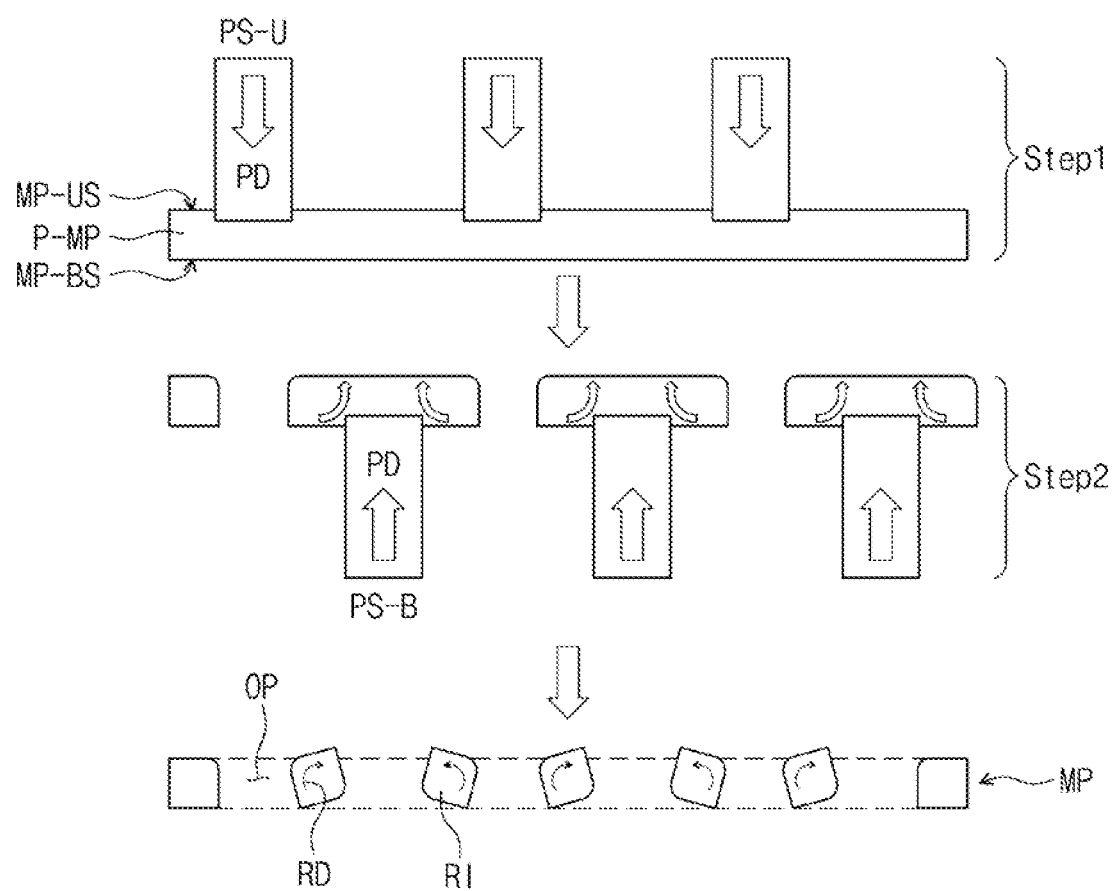
FIG. 13C illustrates a portion of a method for manufacturing a support plate according to an embodiment.

FIGS. 13A to 13C illustrate a processed shape of a processed member according to an insertion direction of a press and an insertion order of the presses, etc.

FIG. 13A illustrates an example in which the processed member P-MP is processed while one press PS sequentially moves in one direction. The press direction PD, which is the operation direction of the press PS, is the direction in which the press moves from the top surface MP-US to the bottom surface MP-BS of the processed member. In this case, a finally processed support plate MP''-1 includes an edge of a bent portion only on the top surface MP-US into which the press PS is inserted. In addition, the finally processed support plate MP''-1 includes support parts RI'-1 that have been rotated in one rotation direction RD.

FIG. 13B illustrates a method in which the plurality of presses PS are inserted into the top surface MP-US of the processed member P-MP at the same time to form the opening OP. In a first process (Step 1), the processed member P-MP is simultaneously processed using three presses PS to form the opening OP, and then, in a second process (Step 2), remaining portions not processed in the first process (Step 1) are processed to form a support plate MP''-2 with additional openings OP. Even when the support plate MP''-2 is manufactured by a method illustrated in FIG. 13B, since the press PS are inserted only in the direction from the top surface MP-US, an edge of the bent portion is provided only on the top surface of the support part RI'-2. When compared to the support plate MP''-1 manufactured by a continuous process illustrated in FIG. 13A, the support plate MP''-2 manufactured by a simultaneous punching process illustrated in FIG. 13B includes other support parts RI'-2 that have been rotated by different directions RD.

FIG. 13C illustrates a partial process of a method for manufacturing a support plate according to an embodiment and an example of a shape of a support plate formed by the partial process of the method for manufacturing the support plate according to an embodiment. The partial process illustrated in FIG. 13C includes both the first process (Step 1), in which the press PS-U is inserted into the top surface MP-US of the processed member P-MP to perform the simultaneous punching, and the second process (Step 2), in which the press PS-B is inserted into the bottom surface MP-BS of the processed member P-MP to perform the simultaneous punching. Referring to FIG. 13C, the support plate MP according to an embodiment, which is manufactured by a method for manufacturing a support plate according to an embodiment, includes a curved edge at one side of the top surface and a curved edge at one side of the bottom surface and that faces the curved edge of the top surface in a diagonal direction. The support plate MP manufactured by a manufacturing method of FIG. 13C according to an embodiment also provides support parts RI that have been rotated in different directions RD.

The support part RI of the support plate MP manufactured according to an embodiment, which includes at least one reverse punching process, i.e. a process of pressing from the direction of the bottom surface, has improved flatness on the processed area when compared to a support plates MP''-1 and MP''-2 processed by using the press inserted only in one direction, i.e., only from the direction of the top surface.

That is, a method for manufacturing a support plate according to an embodiment includes a process of pressing from the direction of the top surface of the processed member and the process of pressing at least once from the direction of the bottom surface of the processed member to facilitate the processing of the opening and improve the flatness of the processed support plate.

A method for manufacturing a support plate according to an embodiment includes a first press process step and a second press process step. The first press process step includes a plurality of opening patterning processes, and the second press process step includes at least one opening patterning process.

Figure 14A:
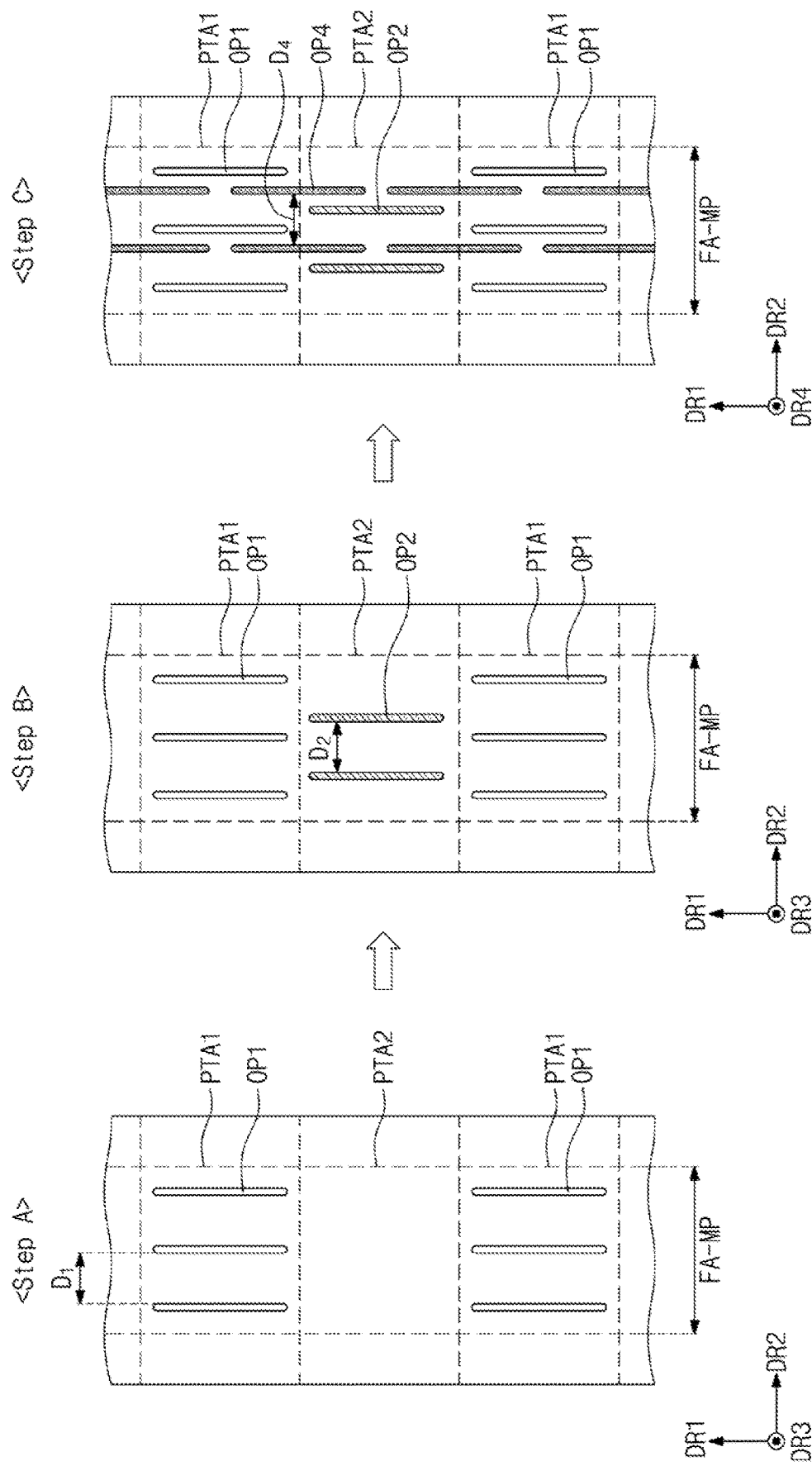
FIG. 14A illustrates a portion of a method for manufacturing a support plate according to an embodiment.
Figure 14B:
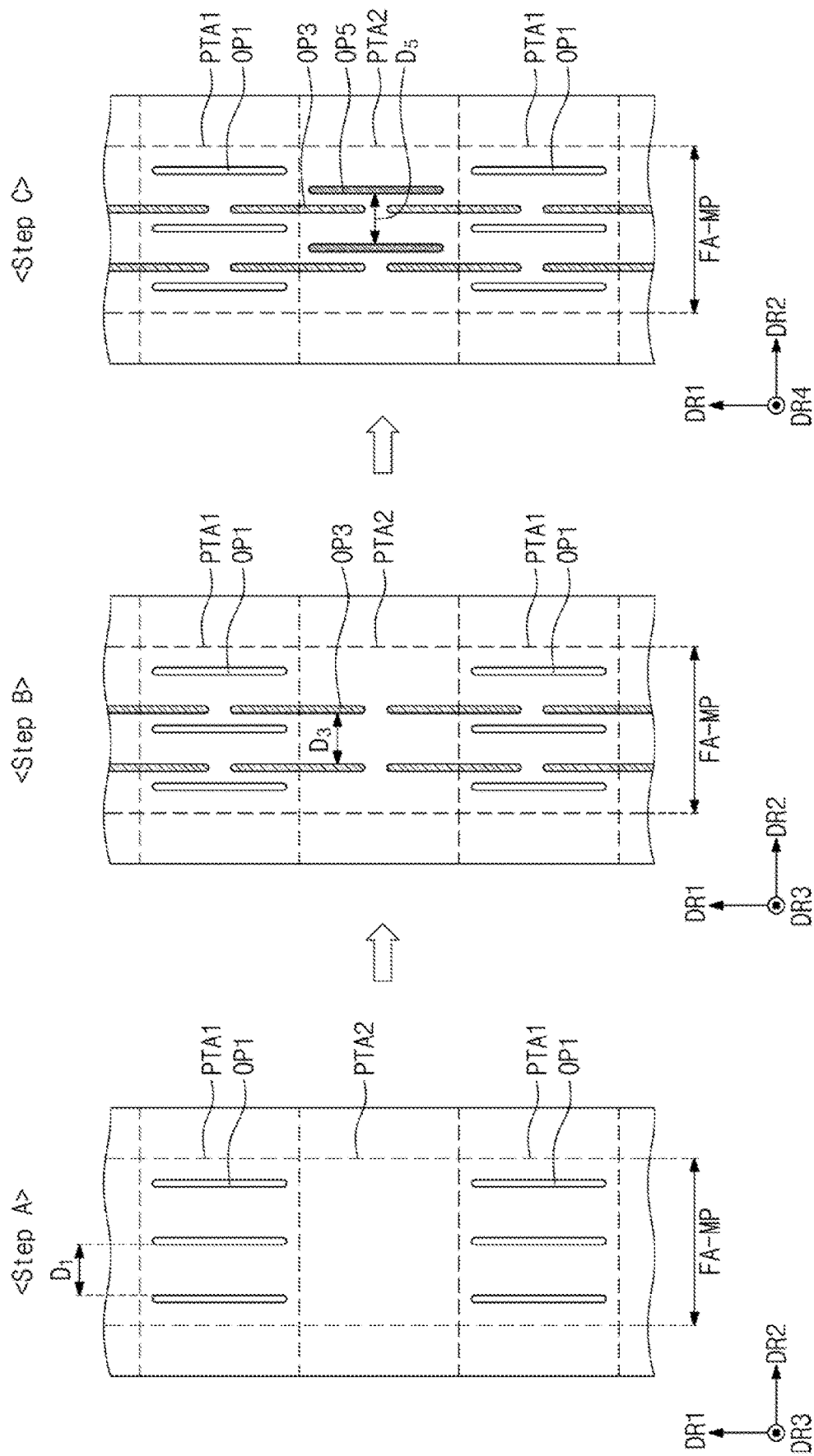
FIG. 14B illustrates a portion of a method for manufacturing a support plate according to an embodiment.

FIGS. 14A and 14B illustrate a partial process of a method for manufacturing a support plate according to an embodiment. FIGS. 14A and 14B show a portion of one processed area PMA (see FIG. 10) to illustrate changes in the arrangement of the openings according to the opening patterning process steps.

In FIGS. 14A and 14B, "Step A" and "Step B" correspond to opening patterning processes of the first press process (S300) (see FIG. 7), and "Step C" corresponds to the opening patterning process of the second press process (S500) (see FIG. 7).

Referring to FIG. 14A, a method for manufacturing a support plate according to an embodiment includes a plurality of the opening patterning processes (Step A and Step B) as the first press process (S300) (see FIG. 7). A method for manufacturing the support plate according to an embodiment includes a process (Step A) of forming a plurality of first openings spaced a first interval apart from each other, hereinafter, referred to as a first opening defining process, and a process (Step B) of forming a plurality of second openings spaced a second interval apart from each other, hereinafter, referred to as a second opening defining process.

According to an embodiment, the first opening defining process (Step A) forms a plurality of first openings OP1 that are spaced a first interval D1 apart from each other in the second direction DR2, in each of a plurality of first pattern areas PTA1 that are spaced apart from each other in the first direction DR1. The first opening defining process (Step A) is performed from the direction of the top surface of the processed member by using the first press PS-U (see FIG. 9).

In an embodiment, the second opening defining process (Step B) forms a plurality of second openings OP2 that are spaced a second interval D2 apart from each other, in each of the first pattern areas PTA1 or each of a second pattern area PTA2 disposed between the first pattern areas PTA1. That is, the second opening defining process (Step B) forms the second openings OP2 that do not overlap the first openings OP1, and the second opening defining process (Step B) is performed by the first press PS-U (see FIG. 9) from the direction of the top surface of the processed member.

According to an embodiment, FIG. 14A shows the second opening defining process (Step B) as forming a plurality of second openings OP2 spaced apart from each other by the second interval D2 in the second pattern area PTA2, but embodiments are not limited thereto. In other embodiments, the second opening defining process (Step B) includes forming the second openings OP2 in the first pattern areas PTA1 so as not to overlap the first openings OP1. In addition, the second openings formed by the second opening defining process (Step B) may include one opening over the first pattern area PTA1 and the second pattern area PTA2.

A method for manufacturing a support plate according to an embodiment includes the second press process (S500) (see FIG. 7) performed after the first press process (S300) (see FIG. 7). The second press process (S500) (see FIG. 7) includes one or more opening patterning process.

According to an embodiment, the second press process (S500) (see FIG. 7) includes at least one process of forming a plurality of openings spaced apart from each other in the second direction DR2 that pass through a portion of the first pattern area PTA1 and a portion of the second pattern area PTA2, or a process of forming a plurality of openings that are spaced apart from each other in the second direction DR2 in the first pattern areas PTA1 or the second pattern area PTA2 disposed between the first pattern areas PTA1.

In an embodiment illustrated in FIG. 14A, the second press process (S500) (see FIG. 7) includes a process (Step C) of penetrating a portion of the first pattern area PTA1 and a portion of the second pattern area PTA2 to form a plurality of fourth openings OP4 spaced a fourth interval D4 apart from each other, hereinafter, referred to as a fourth opening defining process. The fourth opening defining process (Step C) is performed from the direction of the bottom surface of the processed member by using the second press PS-B (see FIG. 9). An embodiment illustrated in FIG. 14A also includes a process (S400) of reversing the processed member between the second opening defining process (Step B) and the fourth opening defining process (Step C).

FIG. 14A illustrates the opening patterning process in the second press process (S500) (see FIG. 7) as the fourth opening defining process (Step C), but embodiments are not limited thereto. In the fourth opening defining process (Step C), the fourth openings OP4 may be formed at positions that differ from the illustrated positions.

Referring to FIG. 14B, a method for manufacturing a support plate according to an embodiment includes a plurality of the opening patterning processes (Step A and Step B) as the first press process (S300) (see FIG. 7). A method for manufacturing a support plate according to an embodiment includes a process (Step A) that forms a plurality of first openings spaced a first interval apart from each other, hereinafter, referred to as a first opening defining process and a process (Step B) that forms a plurality of third openings spaced a third interval apart from each other, hereinafter, referred to as a third opening defining process.

As illustrated in FIG. 14A, in a method according to an embodiment for manufacturing a support plate of FIG. 14B, the first opening defining process (Step A) forms a plurality of first openings OP1 that are spaced a first interval D1 apart from each other in the second direction DR2, in each of a plurality of first pattern areas PTA1 that are spaced apart from each other in the first direction DR1. The first opening defining process (Step A) is performed in the direction from the top surface of the processed member by using the first press PS-U (see FIG. 9).

In an embodiment, the third opening defining process (Step B) forms a plurality of third openings OP3 spaced a third interval D3 apart from each other that pass through a portion of the first pattern area PTA1 and a portion of the second pattern area PTA2. That is, the third opening defining process (Step B) forms the third openings OP3 so as not to overlap the first openings OP1, and the third opening defining process (Step B) is performed by the first press PS-U (see FIG. 9) from the direction of the top surface of the processed member.

The third opening defining process (Step B) illustrated in FIG. 14B is merely an example, and thus embodiments are not limited thereto. In the third opening defining process (Step B), the third openings OP3 may be formed at positions that differ from the illustrated positions.

A method for manufacturing a support plate according to an embodiment includes the second press process (S500) (see FIG. 7) performed after the first press process (S300) (see FIG. 7). The second press process (S500) (see FIG. 7) includes one or more opening patterning processes.

In an embodiment, the second press process (S500) (see FIG. 7) forming a plurality of openings that are spaced apart from each other in the second direction DR2 in the first pattern areas PTA1 or the second pattern area PTA2.

In an embodiment illustrated in FIG. 14B, the second press process (S500) (see FIG. 7) includes a process (Step C) that forms a plurality of fifth openings OP5 that are spaced a fifth interval D5 apart from each other in the second pattern area PTA2, hereinafter, referred to as a fifth opening defining process.

In an embodiment, the fifth opening defining process (Step C) is performed from the direction of the bottom surface of the processed member by using the second press PS-B (see FIG. 9). An embodiment illustrated in FIG. 14B also includes a process (S400) of reversing the processed member between the third opening defining process (Step B) and the fourth opening defining process (Step C).

FIG. 14B illustrates the opening patterning process in the second press process (S500) (see FIG. 7) as the fifth opening defining process (Step C), but embodiments are not limited thereto. In the fifth opening defining process (Step C), the fifth openings OP5 may be formed at positions that differ from the illustrated positions.

In FIGS. 14A and 14B, for convenience of explanation, the first press process (S300) (see FIG. 7) includes two opening patterning process, and the second press process (S500) (see FIG. 7) has one opening patterning process, but embodiments are not limited thereto.

A method for manufacturing a support plate according to an embodiment may include n opening patterning processes to form a plurality of openings in the support plate, where n is a non-negative integer. Among the n opening patterning processes, the second press process performed from the direction of the bottom surface of the processed member includes m opening patterning processes, where m is a non-negative integer, and the first press process performed from the direction of the top surface of the processed member include n-m opening patterning processes.

For example, according to an embodiment, when performing 25 opening patterning processes, the opening patterning process performed from the direction of the top surface of the processed member may be repeatedly performed 24 times, and the second press process performed from the direction of the bottom surface of the processed member may be performed at the last time, i.e., once. However, embodiments of the inventive concept are not limited thereto. Among the 25 opening patterning processes, the second press process performed from the direction of the bottom surface of the processed member may be performed two or more times.

In addition, in a method for manufacturing a support plate according to an embodiment, the number of first press processes performed from the direction of the top surface of the processed member is greater than the number of second press processes performed from the direction of the bottom surface of the processed member. Specifically, the number of first press processes is greater than the number second press processes. However, embodiments are not limited thereto, and a combination of the number of first press processes and the number of second press processes varies depending on the shape and size of the formed opening pattern and the arrangement of the openings.

In FIGS. 14A and 14B, the second press process performed from the direction of the bottom surface of the processed member after the first press process performed from the direction of the top surface of the processed member are sequentially performed, but embodiments are not limited thereto. For example, the first press process performed from the direction of the top surface of the processed member may be further performed after the second press process.

Figure 15:
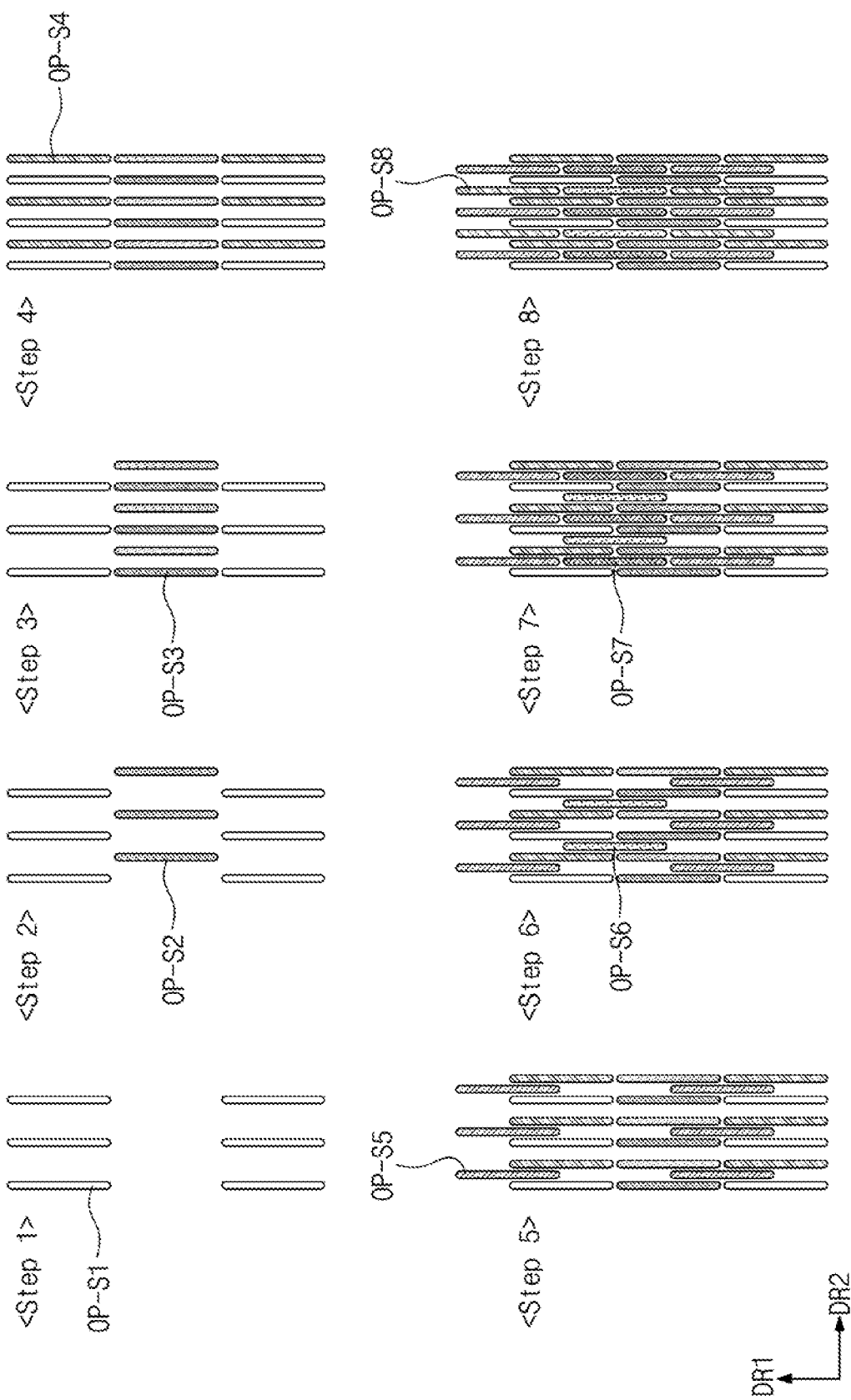
FIG. 15 illustrates a portion of a method for manufacturing a support plate according to an embodiment.

FIG. 15 illustrates a portion of a method for manufacturing a support plate according to an embodiment. FIG. 15 illustrates an example of processes in which the openings are formed in one processed area PMA (see FIG. 10). In FIG. 15, the opening patterning processes are sequentially performed in an order of the first process (Step 1) to the eighth process (Step 8).

According to an embodiment, the first to eighth openings OP-S1 to OP-S8 are formed during different processes so as not to overlap each other. For example, the first openings OP-S1 are formed in the first process (Step 1) in areas spaced apart from each other in the first direction DR1, and then the second openings OP-S2 are formed in the second process (Step 2) in areas between the first openings OP-S1 that are spaced apart from each other in the first direction DR1. In addition, the third opening OP-S3 are formed in the third process (Step 2) in between the second openings OP-S2 that are spaced apart from each other in the second direction DR2. In subsequent processes (Step 4 through STEP 8), the openings OP-S4, OP-S5, OP-S6, OP-S7, and OP-S8 are additionally formed in areas that do not overlap each other.

According to an embodiment, at least one process of the first process (Step 1) to the eighth process (Step 8) illustrated in FIG. 15 is performed in the second press process that is performed from the direction of the bottom surface of the processed member. For example, the eighth process (Step 8) may be performed in the second press process, but embodiments are not limited thereto. The opening patterning process performed in the second press process is included in at least one of the second process (Step 2) to the eighth process (Step 8).

FIG. 16 illustrates a method for manufacturing a support plate according to an embodiment. In an embodiment, in a process (S100) of providing the processed member P-MP, the first press process (S300) and the second press process (S500) are performed so that the processed member P-MP is processed as the support plate MP.

According to an embodiment, the processed member P-MP provided in the process (S100) may be bent in the direction of the first press PS-U after the first press process (S300). That is, after the first press process (S300), the processed member may be bent so that the top surface MP-US has a first bent angle ΘFA-1.

After the first press process (S300), according to an embodiment, the second press process step (S500) is performed, and the top surface MP-US of the processed member has a second bent angle $\theta_{FA-2}$ greater than the first bent angle $\theta_{FA-1}$. That is, after the first press process (S300), the flatness of the processed member increases after processing the processed member from the direction of the bottom surface MP-BS of the processed member. Thereafter, the final support plate MP has improved flatness.

Referring to FIG. 8, the method (S10) for manufacturing a support plate according to an embodiment further includes a process (S600) of flattening the processed member. After the processed member is processed using the second press PS-B, an additional press process is performed using a correction press so that a portion of the curved portion formed during the first press process (S300) and the second press process (S500) is flattened.

Figure 17A:
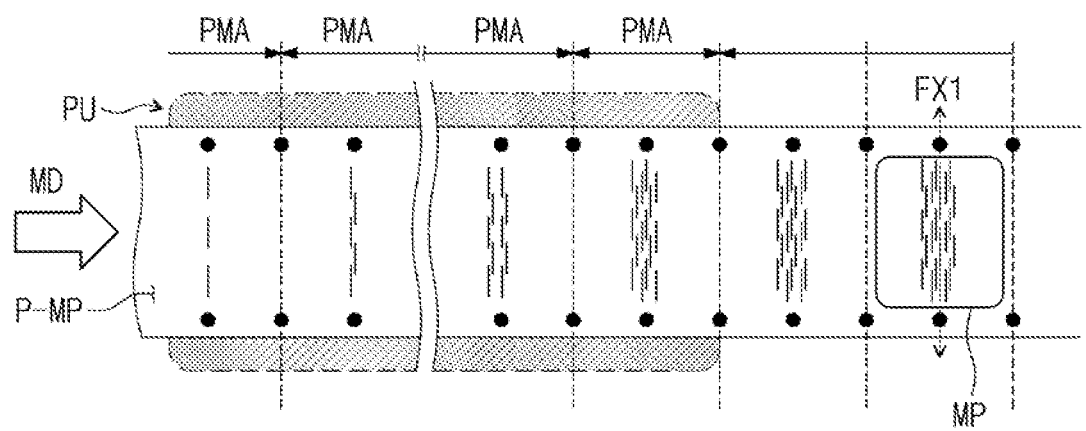
FIG. 17A illustrates a portion of a method for manufacturing a support plate according to an embodiment.
Figure 17B:
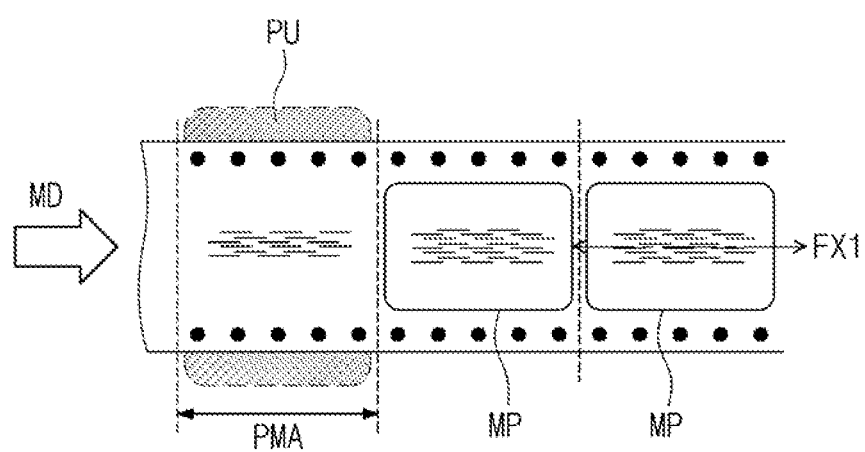
FIG. 17B illustrates a portion of a method for manufacturing a support plate according to an embodiment.

FIGS. 17A and 17B illustrate a portion of a method for manufacturing the support plate according to an embodiment. FIG. 17A illustrates an example in which the processed member is provided so that the folding axis FX1 of the support plate is perpendicular to the machine direction MD, and FIG. 17B illustrates an example in which the processed member is provided so that the folding axis FX1 of the support plate is parallel to the machine direction MD.

In an embodiment illustrated in FIG. 17A, the processed areas PMA adjacent to each other in the machine direction MD are sequentially processed in the press unit PU while proceeding in the machine direction MD. As the processed member P-MP moves in the machine direction MD, the number of openings increases. In an embodiment, the folding axis FX1 of the support plate MP is perpendicular to the machine direction MD, which is the extension direction of the processed member P-MP.

In a method for manufacturing a support plate of FIG. 17A according to an embodiment, the press unit PU covers the processed areas PMA adjacent to each other in the machine direction MD. In a method for manufacturing the support plate of FIG. 17A according to an embodiment, the openings are sequentially formed according to the movement of the processed member P-MP to improve the productivity of processing the support plate MP.

In an embodiment illustrated in FIG. 17B, the press unit PU and one processed area PMA correspond to each other. The processed member P-MP does not move in the machine direction MD and has a plurality of openings formed in one processed area PMA in a stationary state. The plurality of openings are formed by performing the plurality of opening patterning processes on one processed area PMA. In an embodiment, the folding axis FX1 of the support plate MP is parallel to the machine direction MD, which is the extension direction of the processed member P-MP.

In a method for manufacturing a support plate of FIG. 17B according to an embodiment, the press unit PU covers the one processed areas PMA. In a method for manufacturing the support plate of FIG. 17B according to an embodiment, the patterning of the openings is sequentially performed while the processed member P-MP is fixed, thereby improving dimensional accuracy of the formed openings.

In addition, the press unit PU of FIGS. 17A and 17B includes both a first press PS-U and a second press PS-B. That is, even in the embodiment illustrated in FIGS. 17A and 17B, both the first press process that forms the opening from the direction of the top surface MP-US of the processed member and the second press process that forms the opening from the direction of the bottom surface MP-BS of the processed member are performed.

Figure 18:
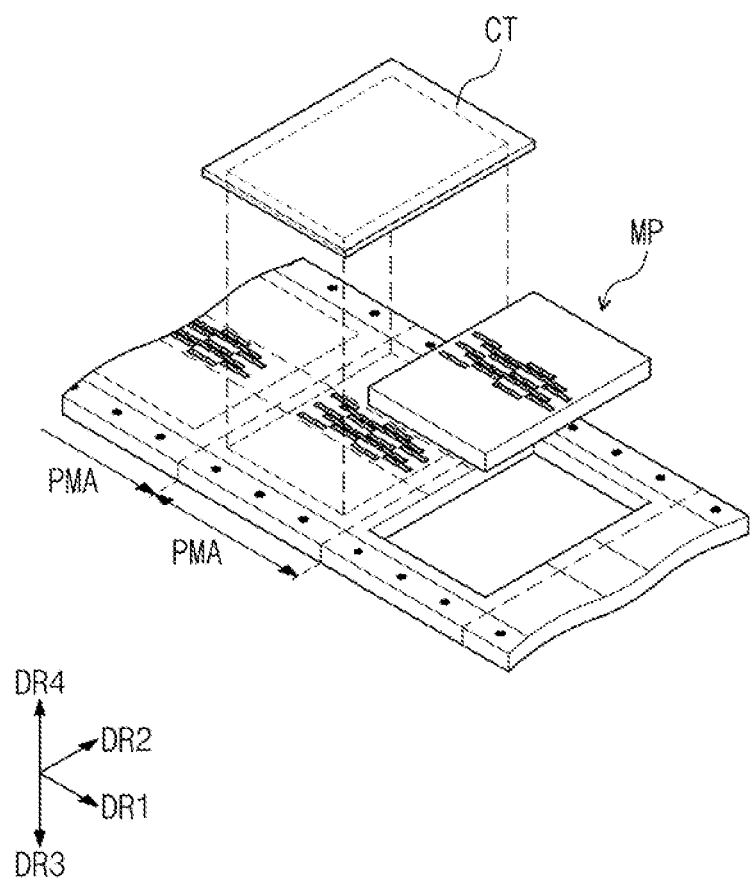
FIG. 18 is a perspective view of a portion of a method for manufacturing a support plate according to an embodiment.

FIG. 18 is a perspective view that illustrates a portion of a method for manufacturing a support plate according to an embodiment. Referring to FIGS. 8 and 18, the method (S10) for manufacturing a support plate according to an embodiment includes a process (S700) of cutting the processed areas. In the method (S10) for manufacturing a support plate according to an embodiment, the process (S700) of cutting the processed areas is performed after the second press process (S500). For example, in the method (S10) for manufacturing a support plate according to an embodiment, after the second press process (S500), the process (S700) of cutting the processed areas is sequentially performed. Alternatively, in an embodiment, the second press process (S500), the process (S600) of correcting the flatness of the processed member, and the process (S700) of cutting the processed areas are sequentially performed.

In an embodiment, the process (S700) of cutting the processed areas corresponds to a process of using a cutting jig CT to mold the processed area PMA into a shape of the support plate MP included in the electronic device ED (see FIG. 3). Referring to FIG. 9, a cutting unit CU includes cutting jig CT and a support substrate ST on which the processed member P-MP is placed. The processed member P-MP is provided to the cutting unit CU after being processed in the second press unit PU2 and is cut using the cutting jig CT to correspond to the shape of the support plate MP. In FIG. 9, the top surface MP-US of the processed member P-MP is placed on the support substrate ST, and the bottom surface MP-BS of the processed member P-MP is directed toward the cutting jig CT, but embodiments are not limited thereto. For example, in other embodiments, the reversing part RL is also further disposed between the second press unit PU2 and the cutting unit CU. In this case, the bottom surface MP-BS of the processed member P-MP is placed on the support substrate ST, and the top surface MP-US of the processed member P-MP is directed toward the cutting jig CT.

In an embodiment, after being processed in the cutting unit CU, the support plate MP is mounted on a moving substrate CVB and provided to a cleaning unit WU. After being cleaned in the cleaning unit WU, the support plate MP is provided to an exterior irradiation unit IU that evaluates quality, such as the size and shape of the opening pattern in the support plate MP.

A method for manufacturing a support plate according to an embodiment processes the support plate in the press and includes at least one reverse punching process to improve the flatness of the portion at which the openings are formed and provides excellent patterning quality of the openings.

Hereinafter, an electronic device according to an embodiment will be described with reference to FIGS. 19A to 20B. Hereinafter, in the description of an electronic device according to an embodiment, contents described with reference to FIGS. 1 to 18 will not be repeated, and differences will be mainly described.

Referring again to FIGS. 3 and 4, the electronic device ED according to an embodiment includes the display module DM and the support plate MP disposed below the display module DM. The support plate MP includes a top surface adjacent to the display module DM and a bottom surface that faces the top surface. The opening pattern OP-PT is formed in the support plate MP and corresponds to the foldable area FA1. The opening pattern OP-PT includes an opening OP that passes through the top and bottom surfaces and a plurality of support parts RI (FIG. 6) around the opening OP.

Figure 19A:
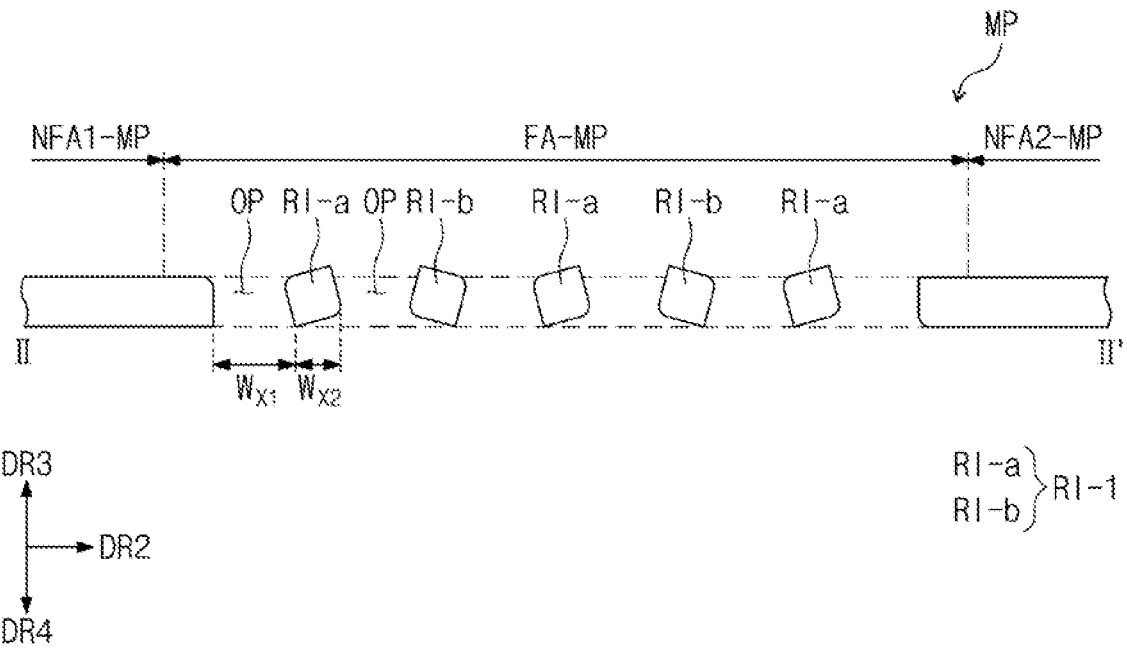
FIGS. 19A and 19B are cross-sectional views of a support plate according to an embodiment.
Figure 19B:
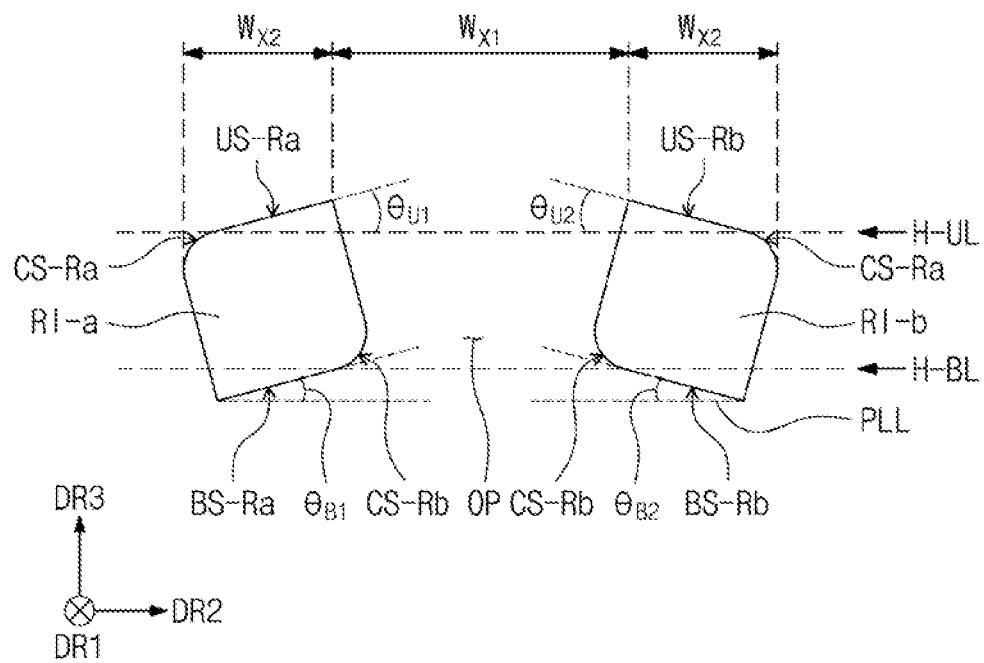

FIGS. 19A and 19B are cross-sectional views of a support plate according to an embodiment. FIG. 19B is an enlarged cross-sectional view of a portion of FIG. 19A. FIG. 19A illustrates a portion that corresponds to line II-II' of FIG. 6.

Referring to FIGS. 19A and 19B, the support plate MP according to an embodiment includes a plurality of first support parts RI-1. The first support parts RI-1 and the opening OP between the first support parts RI-1 are included in the foldable part FA-MP. A width $W_{X1}$ of the opening OP in the second direction DR2 is about 0.15 mm, and a width $W_{X2}$ of the first support part RI-1 in the second direction DR2 is about 0.10 mm. However, embodiments of the inventive concept are not limited thereto.

In an embodiment, each of the first support parts RI-1 includes a first curved edge CS-Ra at one side of the top surface and a second curved edge CS-Rb at one side of the bottom surface, which faces the first curved edge CS-Ra in the diagonal direction. The first support part RI-1 includes first flat top surfaces US-Ra and US-Rb adjacent to the first curved edge CS-Ra and first flat bottom surfaces BS-Ra and BS-Rb adjacent to the second curved edge CS-Rb. The first flat top surfaces US-Ra and US-Rb and the first flat bottom surfaces BS-Ra and BS-Rb of the first support part RI-1 are inclined with respect to virtual extension surfaces H-UL, H-BL, and PLL that are parallel to a surface of the non-foldable parts NFA1-MP and NFA2-MP of the support plate, respectively. The virtual extension surfaces H-UL, H-BL, and PLL are also parallel to a plane defined by the first direction DR1 and the second direction DR2. Angles at which the first flat top surfaces US-Ra and US-Rb or the first flat bottom surfaces BS-Ra and BS-Rb are inclined with respect to the virtual extension surfaces H-UL, H-BL, and PLL are greater than about 0 degree and less than about 15 degrees.

Referring to FIGS. 19A and 19B, the support plate MP according to an embodiment includes a first sub-support part RI-a and a second sub-support part RI-b that are adjacent to each other with the opening OP therebetween. The opening OP between the first and second sub-support parts RI-a and RI-b is formed by performing press processing from the direction of the bottom surface of the support plate.

In an embodiment, the first sub-support part RI-a and the second sub-support part RI-b are partially rotated in opposite directions. For example, in an embodiment, the first flat top surface US-Ra of the first sub-support part RI-a is inclined in a counterclockwise direction with respect to the virtual extension surface H-UL, and the first flat top surface US-Rb of the second sub-support part RI-b is inclined in a clockwise direction with respect to the virtual extension surface H-UL. Angles $\Theta U1$ and $\Theta U2$ between the first flat top surface US-Ra of the first sub-support part RI-a and the virtual extension surface H-UL, and between the first flat top surface US-Rb of the second sub-support part RI-b and the virtual extension surface H-UL, respectively, are independently greater than 0 degree and less than about 15 degrees. Also, angles $\Theta B1$ and $\Theta B2$ between the first flat bottom surface BS-Ra of the first sub-support part RI-a and the virtual extension surface PLL, and between the first flat bottom surface BS-Rb of the second sub-support part RI-b and the virtual extension surface PLL, respectively, are independently greater than 0 degree and less than about 15 degrees.

In an embodiment, the first flat top surface US-Ra of the first sub-support part RI-a and the first flat top surface US-Rb of the second sub-support part RI-b are symmetric to each other with respect to a center of the opening OP therebetween. However, embodiments of the inventive concept are not limited thereto.

Figure 20A:
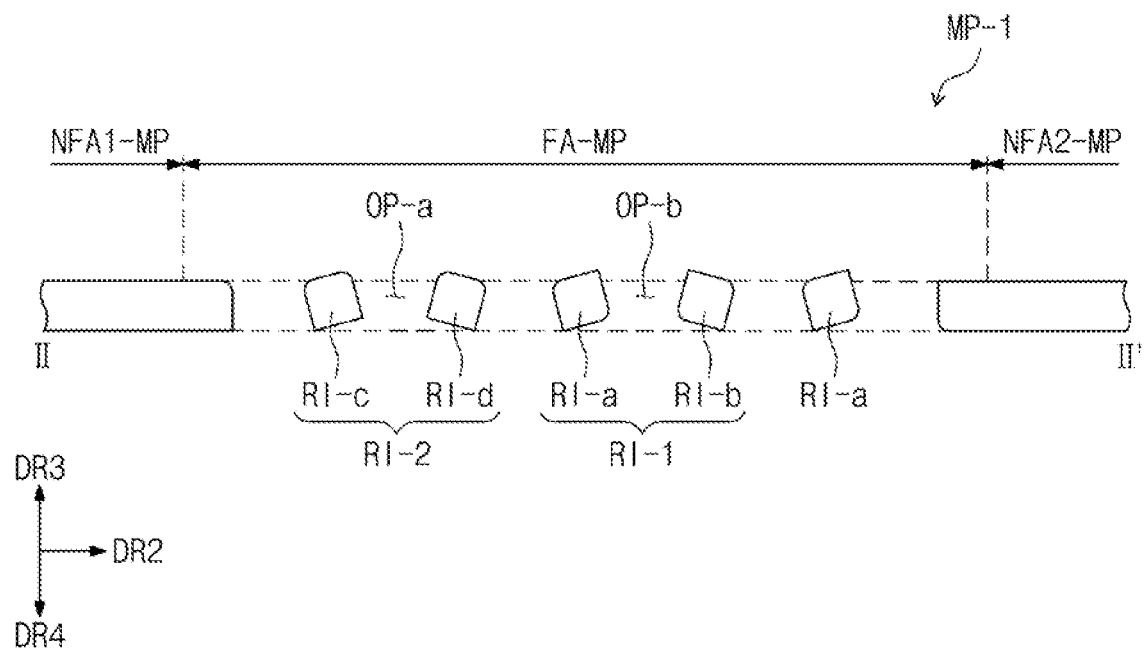
FIGS. 20A and 20B are cross-sectional view of a support plate according to an embodiment.
Figure 20B:
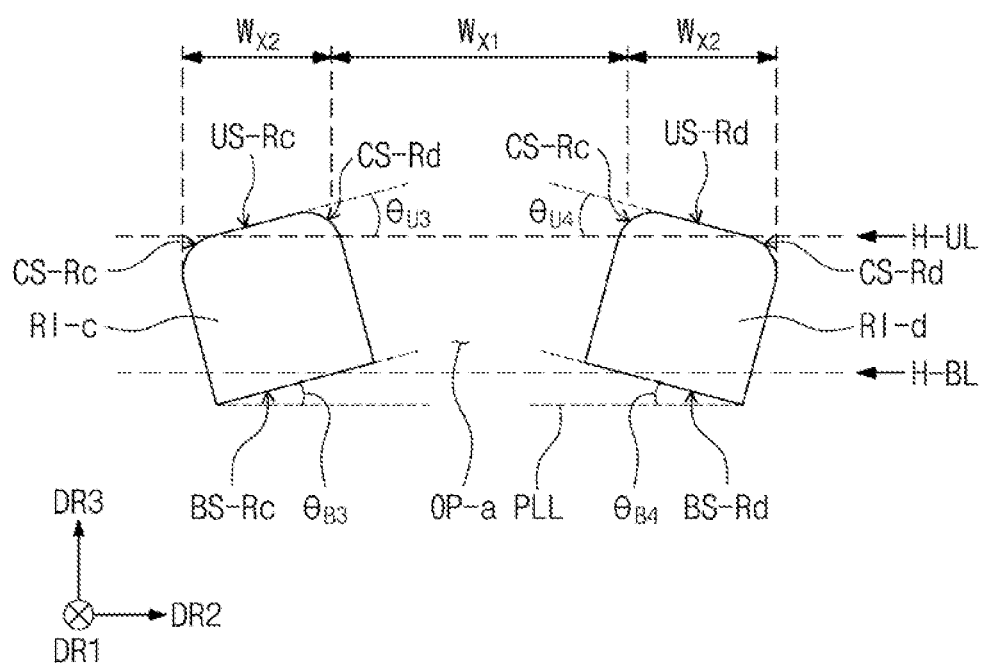

FIG. 20A is a cross-sectional view of a support plate according to an embodiment. FIG. 20B is an enlarged cross-sectional view of a portion of FIG. 20A. FIG. 20A illustrates a portion that corresponds to line II-II' of FIG. 6.

Referring to FIGS. 20A and 20B, the support plate MP according to an embodiment includes a first support part RI-1 and a second support part RI-2. That is, the support plate MP-1 according to an embodiment further includes a second support part RI-2 when compared to the support plate MP according to an embodiment that is described with reference to FIGS. 19A and 19B.

In the support plate MP-1 according to an embodiment, each of the first support parts RI-1 includes a first curved edge CS-Ra at one side of the top surface and a second curved edge CS-Rb at one side of the bottom surface, which faces the first curved edge CS-Ra in the diagonal direction. Also, in cross-section, each of the second support parts RI-2 includes a third curved edge CS-Rc at one side of the top surface and a fourth curved edge CS-Rd at another side of the top surface that is spaced apart from the third curved edge CS-Rc.

According to an embodiment, the second support parts RI-2 include second flat top surfaces US-Rc and US-Rd disposed between the third curved edge CS-Rc and the fourth curved edge CS-Rd and second flat bottom surfaces BS-Rc and BS-R that are opposite to the second flat top surfaces US-Rc and US-Rd. The second flat top surfaces US-Rc and US-Rd and the second flat bottom surfaces BS-Rc and BS-Rd of the second support part RI-2 are inclined with respect to virtual extension surfaces H-UL, H-BL, and PLL that are parallel to the plane defined by the first direction DR1 and the second direction DR2 and to a surface of one of the non-folding parts NFA1-MP and NFA2-MP of the support plate. Angles at which the second flat top surfaces US-Re and US-Rd or the second flat bottom surfaces BS-Rc and BS-Rd are inclined with respect to the virtual extension surfaces H-UL, H-BL, and PLL are greater than about 0 degree and less than about 15 degrees.

Referring to FIGS. 20A and 20B, the support plate MP-1 according to an embodiment includes a first sub-support part RI-a and a second sub-support part RI-b that are adjacent to each other with an opening OP-b therebetween, and a third sub-support part RI-c and a fourth sub-support part RI-d that are adjacent to each other with an opening OP-a therebetween. The opening OP-b between the first and second sub-support parts RI-a and RI-b is formed by press processing from the direction of the bottom surface of the support plate. The opening OP-a between the third and fourth sub-support parts RI-c and RI-d is formed by press processing from the direction of the top surface of the support plate.

In an embodiment, the third and fourth sub-support parts RI-c and RI-d adjacent to each other with one opening OP-a therebetween are partially rotated in opposite directions. For example, in an embodiment, the second flat top surface US-Rc of the third sub-support part RI-c is inclined in the counterclockwise direction with respect to the virtual extension surface H-UL, and the second flat top surface US-Rd of the fourth sub-support part RI-d is inclined in the clockwise direction with respect to the virtual extension surface H-UL. Angles $\Theta U3$ and $\Theta U4$ between the second flat top surface US-Rc of the third sub-support part RI-c and the virtual extension surface H-UL, and between the second flat top surface US-Rd of the fourth sub-support pan RI-d and the virtual extension surface H-UL, respectively, are independently greater than 0 degree and less than about 15 degrees. In addition, angles $\Theta B3$ and $\Theta B4$ between the second bottom surface BS-Rc of the third sub-support part RI-c and the virtual extended surface PLL, and between the second flat bottom surface BS-Rd of the fourth sub-support part RI-d and the virtual extended surface PLL, respectively, are independently greater than 0 degree and less than about 15 degrees.

In an embodiment, the second flat top surface US-Rc of the third sub-support part RI-c and the second flat top surface US-Rd of the fourth sub-support part RI-d are symmetric to each other with respect to a center of the opening OP-a therebetween. However, embodiments of the inventive concept are not limited thereto.

The components of an electronic device according to an embodiment described with reference to FIGS. 3 and 20B have been described with reference to an electronic device illustrated in FIGS. 1A to 1D according to an embodiment, but embodiments are not limited thereto. The components of an electronic device according to an embodiment described with reference to FIGS. 3 and 20B can be incorporated into the electronic device ED-a according to an embodiment described with reference to FIGS. 2A and 2B. That is, even when the folding axis FX2 is parallel to the direction of the short side of the electronic device ED-a, the above-described support plate can be incorporated thereinto.

Figure 21A:
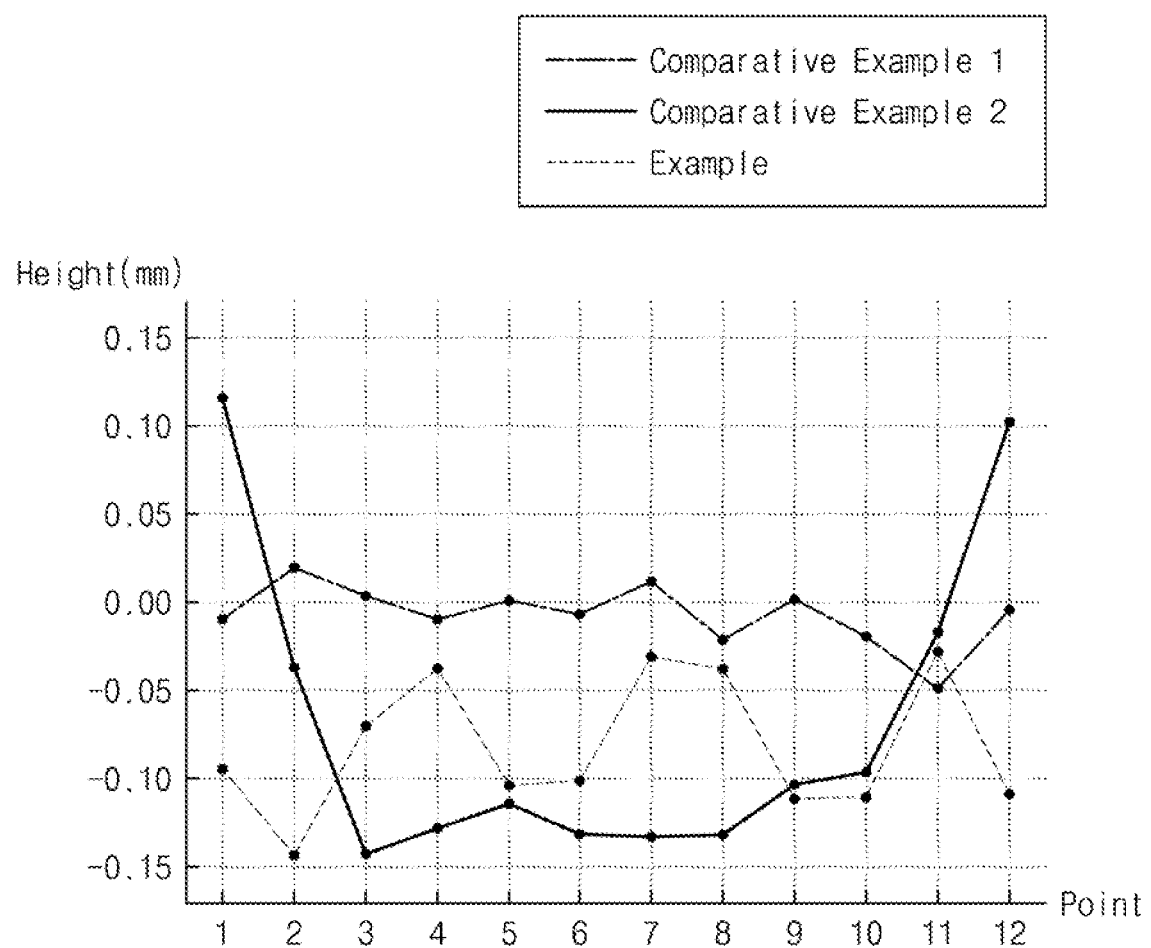
FIG. 21A is a graph that illustrates results obtained by evaluating flatness of support plates according to a comparative example and an embodiment.
Figure 21B:
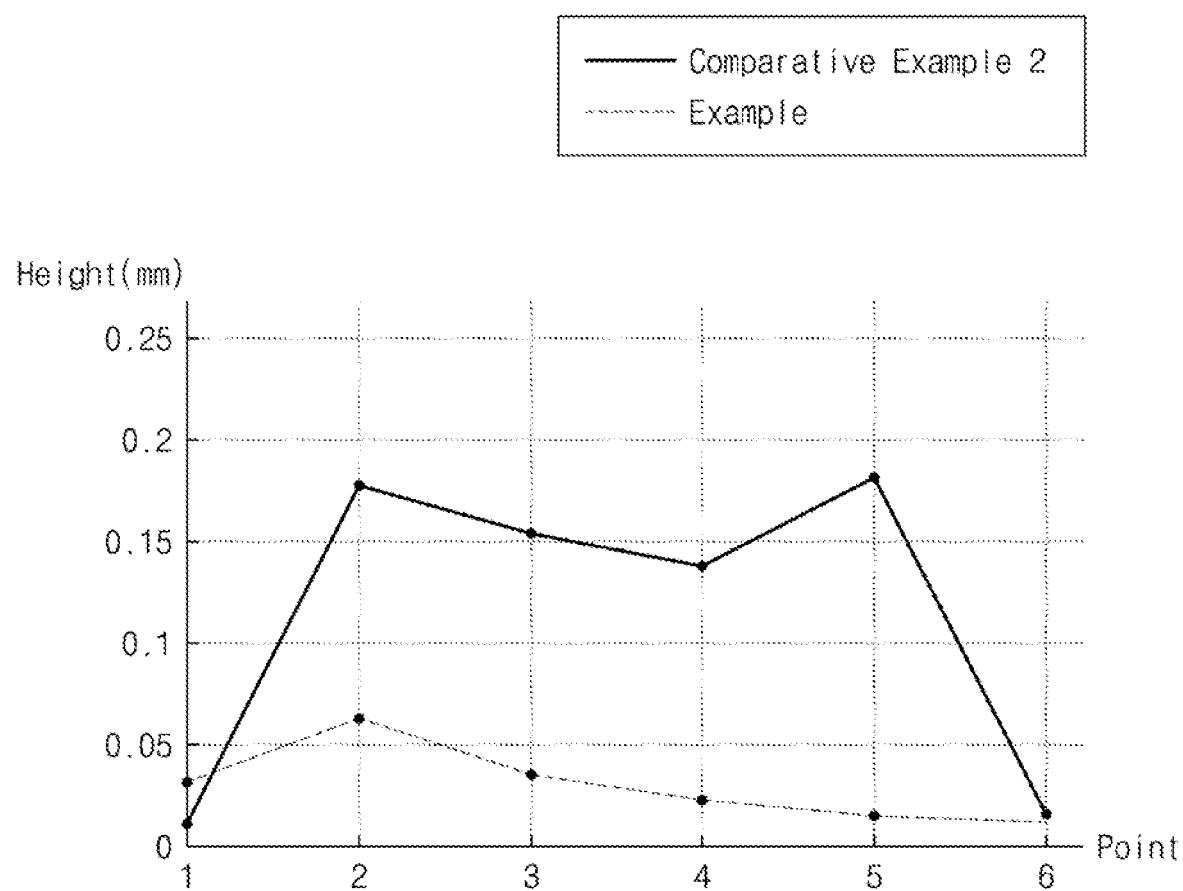
FIG. 21B is a graph that illustrates results obtained by evaluating flatness of support plates according to a comparative example and an embodiment.

FIGS. 21A and 21B illustrate results obtained by evaluating flatness of a support plate according to an embodiment and that is manufactured by a method for manufacturing a supporting plate according to an embodiment of the inventive concept and a support plate according to a comparative example and that is manufactured by a method different from that of an embodiment. FIG. 21A illustrates results obtained by measuring flatness in the foldable part FA-MP (see FIG. 5) of the support plate, and FIG. 21b illustrates results obtained by evaluating flatness of an entire support plate that includes the non-foldable parts NFA1-MP and NFA2-MP (see FIG. 3) and the foldable part FA-MP (see FIG. 5). FIG. 21C is a schematic view that illustrates a method for evaluating the flatness of the support plate. In the graphs shown in FIGS. 21A and 21B, "Point" on an X axis indicates a measurement point, and "Height" on a Y axis indicates a relative height of the support plate at each point measured by a measuring instrument.

In FIG. 21A, Comparative Example 1 corresponds to a case in which an opening pattern is formed on the foldable part in an etching process, and Comparative Example 2 corresponds to a case in which an opening pattern is formed on the foldable part by a press method. This corresponds to a case in which the opening pattern is formed by pressing in only one direction, such as an upward direction. Example in FIG. 21A corresponds to a case in which the opening pattern is formed by performing both a first press process from a direction of a top surface of the processed member and a second press process from a bottom surface of the processed member. In the results shown in FIG. 21A, Comparative Example 2 corresponds to the support plate in which the opening pattern is formed by pressing 20 times only from the direction of the top surface of the processed member, and Example corresponds to the support plate in which the opening pattern is formed by pressing 5 times after the second press process.

Referring to FIG. 21A, in the case of Comparative Example 1, a difference between a minimum height and a maximum height corresponds to about 0.07 mm, and thus, it is seen that a relatively flat support plate is formed. However, when the opening pattern is formed on the support plate by etching, there is a limitation in that a cross-sectional shape of the opening pattern is poor. When comparing the flatness according to Comparative Example 2 and Example, in Comparative Example 2, a difference between a minimum height and a maximum height corresponds to about 0.26 mm, but in the case of Embodiment, a difference between a minimum height and a maximum height corresponds to about 0.11 mm, and thus, it is seen that the flatness of Example is improved when compared to Comparative Example 2. Referring to FIG. 21B, in the case of Comparative Example 2 which corresponds to the support plate in which the opening pattern is formed by pressing 20 times from only the direction of the top surface of the processed member, the difference between a minimum height and a maximum height in the entire support plate corresponds to about 0.16 mm. In comparison, in the case of Example in which the opening pattern is formed by performing the first press process 15 times and then the second press process 5 times, the difference between a minimum height and a maximum height is about 0.02 mm, and thus it is seen that a support plate manufactured in an embodiment has improved flatness characteristics.

In a support plate according to an embodiment, the flatness refers to the relative flatness characteristics of the top surface MP-US or the bottom surface MP-BS of the support plate MP. In this specification, a height deviation of the top surface MP-US of the support plate MP based on a virtual surface has been described as a measure of flatness. That is, in this specification, a difference ($h_{max}-h_{min}$) between the maximum height ($h_{max}$) and the minimum height ($h_{min}$) of the top surface MP-US of the support plate MP based on a virtual surface parallel to the plane defined by the first direction DR1 and the second direction DR2 is defined as flatness.

Referring to FIGS. 21A to 21C, the flatness of the support plate MP according to an embodiment is about 0.15 mm or less. That is, a support plate according to an embodiment is manufactured by a method that includes a second press process that corresponds to a reverse punching process, and thus, it is seen that a thickness deviation in one plane, either the top surface or bottom surface, has superior flatness characteristics.

Figure 22:
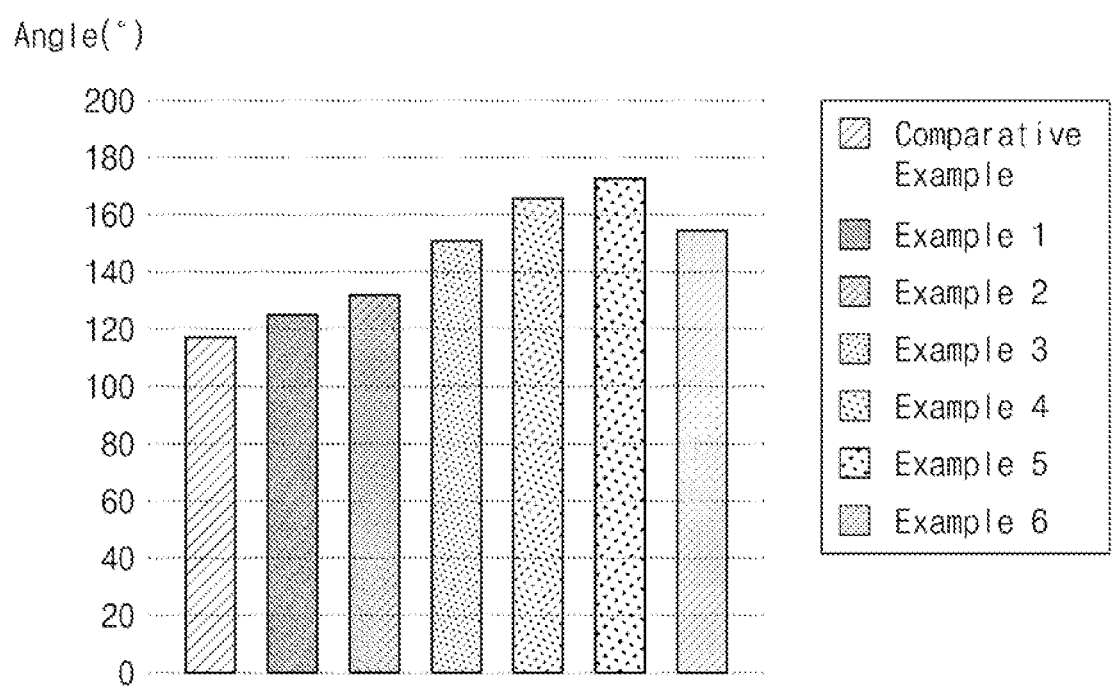
FIG. 22 is a graph that illustrates a variation in a bending angle of a support plate according to a number of times a second press process was performed, according to an embodiment.

FIG. 22 illustrates bent angles of a support plate in a final state according to the number of times the second press process of pressing from the direction of the bottom surface of the processed member is performed. In FIG. 22, Comparative Example corresponds to a support plate in which the opening pattern is formed by performing the pressing 20 times from only the direction of the top surface of the processed member. Examples 1 to 6 correspond to support plates manufactured by performing the first press process and the second press process as shown in Table 1 below.

TABLE 1

| Classification | Number of times of first press process/ Number of times of second press process |
|---|---|
| Example 1 | 10/10 |
| Example 2 | 12/8 |
| Example 3 | 13/7 |
| Example 4 | 15/5 |
| Example 5 | 16/4 |
| Example 6 | 17/3 |

Referring to FIG. 22, in Comparative Example, the bent angle corresponds to about 118°, and in the case of Examples, in which the support plate is formed by performing a second press process that corresponds to a reverse punching, it is seen that the bent angle increases when compared to Comparative Example.

The bent angle of the support plate according to Examples is greater than or equal to about 120° and less than or equal to about 180°. That is, a support plate manufactured by a method for manufacturing a support plate according to Examples that include a second press process that corresponds to a reverse punching process has improved flatness characteristics when compared to Comparative Example.

An electronic device according to an embodiment is disposed below the display module and includes the support plate that has an opening pattern that includes at least one support part that has a first curved edge at one side of the top surface and a second curved edge at one side of the bottom surface that faces the first curved edge in the diagonal direction, to improve the exterior quality. An electronic device according to an embodiment has the improved flatness characteristics of the display surface.

In addition, a method for manufacturing a support plate according to an embodiment provides a support plate that has high dimensional stability in the opening, good mechanical properties, and improved flatness by including at least one reverse punching process in the press method.

An electronic device according to an embodiment is flexible and substantially flat in the foldable area by including openings that are pressed toward the top surface and the bottom surface thereof.

A method for manufacturing a support plate according to an embodiment includes a process of pressing toward the bottom surface of the member to be processed and thus is used to manufacture a support plate having improved flatness.

It will be apparent to those skilled in the art that various modifications and deviations can be made in embodiments of the inventive concept. Thus, it is intended that embodiments of the present disclosure cover the modifications and deviations of the inventive concept provided they come within the scope of the appended claims and their equivalents.

Accordingly, the technical scope of embodiments of the inventive concept should not be limited to the contents described in the detailed description of the specification, but should be determined by the claims.

What is claimed is:

1. A method for manufacturing a support plate, comprising:
   providing a member to be processed wherein the member to be processed includes a top surface and a bottom surface that face each other, and the member to be processed is divided into a foldable part and a non-foldable part;
   forming, in a first press process, a first opening pattern on the foldable part by using a first press from a direction of the top surface of the member to be processed, wherein the first opening pattern comprises a first opening that passes through the member to be processed from the top surface to the bottom surface and a plurality of preliminary support parts spaced apart from each other with the first opening therebetween; and
   forming, in a second press process, a second opening pattern on the foldable part by using a second press from a direction of the bottom surface of the member to be processed, wherein the second opening pattern comprises a second opening that passes through the member to be processed from the top surface to the bottom surface; and
   performing a reversing process that reverses the directions of the top surface and the bottom surface of the member to be processed between the first press process and the second press process,
   wherein the first opening and the second opening do not overlap.

2. The method of claim 1, wherein
   each of the preliminary support parts includes a curved edge on the top surface adjacent to the first opening.

3. The method of claim 2, wherein the second press process includes patterning at least one of the preliminary support parts by using the second press.

4. The method of claim 3, wherein the second press process forms the second opening in at least one of the preliminary support parts, and
   the second press process includes forming a first support part adjacent to the second opening, wherein the first support part includes a first curved edge at one side of the top surface and a second curved edge at one side of the bottom surface that faces the first curved edge in a diagonal direction.

5. The method of claim 1, wherein the first press process forms a plurality of first openings that do not overlap each other and are parallel to a first direction in the foldable part, and
   on a plane, a first width each of the first openings in the first direction is greater than a second width of each of the first openings in a second direction perpendicular to the first direction.

6. The method of claim 5, wherein the plurality of first openings that are spaced a first interval apart from each other in the second direction in each of a plurality of first pattern areas that are spaced apart from each other in the first direction.

7. The method of claim 6, wherein the first press process further
comprises at least one of:
   a process of forming a plurality of third openings that are spaced a second interval apart from each other in the first pattern areas or a second pattern area disposed between the first pattern areas; or
   a process of forming a plurality of fourth openings that are spaced a third interval apart from each other, wherein each of the plurality of third openings passes through a portion of the first pattern area and a portion of the second pattern area that are adjacent to each other.

8. The method of claim 6, wherein the second press process includes forming a plurality of second openings that are spaced a fourth interval apart from each other, wherein each of the plurality of second openings passes through a portion of the first pattern area and a portion of the second pattern area that are adjacent to each other.

9. The method of claim 6, wherein the second press process includes forming a plurality of fifth openings that are spaced a fifth interval apart from each other in the first pattern areas or a second pattern area located between the first pattern areas.

* * * * *